United States Patent
Murakawa et al.

(10) Patent No.: US 9,380,701 B2
(45) Date of Patent: Jun. 28, 2016

(54) LAMINATE, CONDUCTIVE PATTERN, AND METHOD FOR PRODUCING LAMINATE

(71) Applicant: DIC Corporation, Tokyo (JP)

(72) Inventors: Akira Murakawa, Osaka (JP); Jun Shirakami, Osaka (JP); Wataru Fujikawa, Osaka (JP); Yukie Saitou, Osaka (JP)

(73) Assignee: DIC CORPORATION, Tokyo (JP)

( * ) Notice: Subject to any disclaimer, the term of this patent is extended or adjusted under 35 U.S.C. 154(b) by 0 days.

(21) Appl. No.: 14/775,576

(22) PCT Filed: Mar. 6, 2014

(86) PCT No.: PCT/JP2014/055830
§ 371 (c)(1),
(2) Date: Sep. 11, 2015

(87) PCT Pub. No.: WO2014/142005
PCT Pub. Date: Sep. 18, 2014

(65) Prior Publication Data
US 2016/0037632 A1    Feb. 4, 2016

(30) Foreign Application Priority Data
Mar. 13, 2013    (JP) ................. 2013-050419

(51) Int. Cl.
| | | |
|---|---|---|
| *H05K 1/09* | (2006.01) | |
| *H05K 3/12* | (2006.01) | |
| *B32B 7/02* | (2006.01) | |
| *B32B 27/00* | (2006.01) | |
| *G06K 19/077* | (2006.01) | |
| *H05K 1/02* | (2006.01) | |
| *H05K 1/03* | (2006.01) | |
| *H05K 3/18* | (2006.01) | |
| *H05K 3/24* | (2006.01) | |
| *H05K 3/38* | (2006.01) | |

(52) U.S. Cl.
CPC *H05K 1/092* (2013.01); *B32B 7/02* (2013.01); *B32B 27/00* (2013.01); *G06K 19/07722* (2013.01); *H05K 1/0298* (2013.01); *H05K 1/0346* (2013.01); *H05K 3/1208* (2013.01); *H05K 3/1283* (2013.01); *H05K 3/181* (2013.01); *H05K 3/246* (2013.01); *H05K 3/386* (2013.01); *H05K 2201/0154* (2013.01)

(58) Field of Classification Search
CPC ....... H05K 1/092; H05K 1/095; H05K 1/097; H05K 3/1283; H05K 3/1291
See application file for complete search history.

(56) References Cited

FOREIGN PATENT DOCUMENTS

| | | |
|---|---|---|
| JP | 8-139458 A | 5/1996 |
| JP | 2004-288818 A | 10/2004 |

(Continued)

OTHER PUBLICATIONS

International Search Report PCT/JP2014/055830 dated Jun. 10, 2014 with English translation.

*Primary Examiner* — Jeremy C Norris
(74) *Attorney, Agent, or Firm* — McDermott Will & Emery LLP

(57) ABSTRACT

Provided is a laminate in which at least a layer including a support, a primer layer, a first conductive layer, an insulating layer, and a second conductive layer are laminated, wherein the insulating layer is formed by coating at least a portion of or entirety of a surface of the first conductive layer with a resin composition and drying the resin composition; and the second conductive layer includes a second plating seed layer formed by coating a portion of or entirety of a surface of the insulating layer with a fluid containing a conductive substance, and a second plating layer formed on a surface of the second plating seed layer. This laminate has high adhesion between layers and allows the high adhesion to be maintained even upon exposure to a high-temperature and high-humidity environment.

10 Claims, 1 Drawing Sheet

(56) References Cited

FOREIGN PATENT DOCUMENTS

| | | |
|---|---|---|
| JP | 2005-286158 A | 10/2005 |
| JP | 2009-049124 A | 3/2009 |
| JP | 2011-105903 A | 6/2011 |
| JP | 2012-28563 A | 2/2012 |
| JP | 2012-128629 A | 7/2012 |
| JP | 2012-221891 A | 11/2012 |
| JP | 2012-246533 A | 12/2012 |
| WO | 2008/018589 A1 | 2/2008 |
| WO | 2011/089922 A1 | 7/2011 |

LAMINATE, CONDUCTIVE PATTERN, AND METHOD FOR PRODUCING LAMINATE

CROSS-REFERENCE TO RELATED APPLICATIONS

This application is the U.S. National Phase of PCT/JP2014/055830 filed Mar. 6, 2014, which claims priority to Japanese Patent Application No. 2013-050419 filed Mar. 13, 2013. The subject matter of each is incorporated herein by reference in entirety.

TECHNICAL FIELD

The present invention relates to a laminate such as a conductive pattern that can be used for producing an electromagnetic shield, an integrated circuit, or an organic transistor, for example.

BACKGROUND ART

With the development of electronic devices having higher performance, a smaller size, and a smaller thickness, there has recently been a strong demand for an increase in the density of and reduction in the thickness of electronic circuits and integrated circuits of the electronic devices.

Such a conductive pattern that can be used for an electronic circuit or the like is, for example, a known conductive pattern produced by coating a surface of a support with a conductive ink or a plating nucleating agent containing a conductive substance such as silver and firing the coated substance to form a conductive substance layer; and subsequently by plating the surface of the conductive substance layer to form a plating layer on the surface of the conductive substance layer (for example, refer to Patent Literature 1).

However, in the conductive pattern, the adhesion between the support and the conductive substance layer is insufficient. Accordingly, in some cases, with passage of time, the conductive substance becomes separated from the surface of the support, which causes disconnection in the conductive pattern formed of the conductive substance or degradation of conductivity (increase in resistance).

As a method for enhancing the adhesion between the support and the conductive substance, for example, there is a known method of producing a conductive pattern in which a pattern is formed in a predetermined manner with a conductive ink on an ink-receiving substrate in which a latex layer is formed on the surface of a support (refer to Patent Literature 2).

However, the conductive pattern obtained by this method is still insufficient in terms of adhesion between the support and the ink-receiving layer in some cases. Accordingly, with passage of time, the ink-receiving layer and the conductive substance become separated from the surface of the support, which causes disconnection in the conductive pattern formed of the conductive substance or degradation of conductivity in some cases. In other cases, upon use of the conductive pattern in a high temperature or high humidity environment, the adhesion is considerably degraded, which sometimes results in separation of the conductive substance.

The separation of the ink-receiving layer from the surface of the support occurs because, for example, sufficiently high durability against acidic or alkaline reagents used in the plating step or the like is not provided. For this reason, in some cases, the conductive pattern cannot be subjected to plating intended to enhance the strength, for example.

CITATION LIST

Patent Literature

PTL 1: Japanese Unexamined Patent Application Publication No. 2005-286158
PTL 2: Japanese Unexamined Patent Application Publication No. 2009-49124

SUMMARY OF INVENTION

Technical Problem

An object of the present invention is to provide a laminate that has high adhesion between layers and has resistance to humidity and heat that allows the high adhesion to be maintained even upon exposure to a high-temperature and high-humidity environment.

Solution to Problem

The inventors of the present invention performed studies on how to achieve the above-described object. As a result, the inventors have found a laminate excellent in terms of adhesion and resistance to humidity and heat.

Specifically, the present invention relates to a laminate and a conductive pattern that have a structure in which at least a layer (A) including a support, a first primer layer (B-1), a first conductive layer (C), an insulating layer (D), a second primer layer (B-2), and a second conductive layer (E) are laminated.

Advantageous Effects of Invention

A laminate according to the present invention can maintain high adhesion even upon exposure to a high-temperature and high-humidity environment and, as a result, can maintain high conductivity without causing disconnection or the like. Accordingly, the laminate can be used in a novel field such as, in general, the printed electronics field, which relates to, for example, formation of electronic circuits in, for example, organic solar cells, electronic book terminals, organic EL, organic transistors, flexible printed boards, and RFIDs of noncontact IC cards and the like; and manufacturing of wiring of electro-magnetic shields in plasma displays, integrated circuits, and organic transistors.

DESCRIPTION OF EMBODIMENTS

Figure 1:
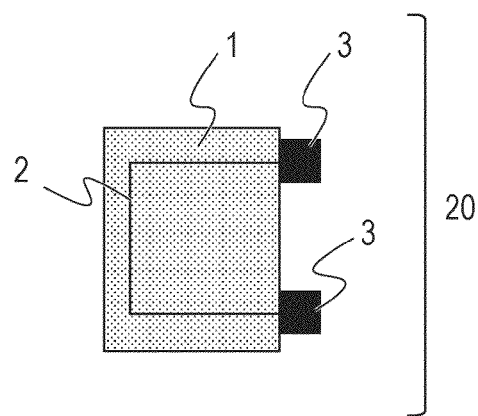
FIG. 1 is a top view of a conductive pattern in which a first conductive layer (C) is formed on the surface of a first primer layer (B-1).

A laminate according to the present invention is a laminate having a structure in which at least a layer (A) including a support, a first primer layer (B-1), a first conductive layer (C), an insulating layer (D), a second primer layer (B-2), and a second conductive layer (E) are laminated. A laminate according to the present invention may include, in addition to the layers (A) to (E), other layers.

A laminate according to the present invention includes a first primer layer (B-1) between a layer (A) including a support and a first conductive layer (C).

The first primer layer (B-1) is a layer that receives a fluid (c-1) containing a conductive substance that can be used for forming the first conductive layer (C). Upon coming into contact with the fluid (c-1), the primer layer (B-1) quickly absorbs a solvent contained in the fluid (c-1) and holds the conductive substance on the surface of the primer layer (B-1). This can considerably enhance resistance to humidity and heat and adhesion between the layer (A) including a support, the primer layer (B-1), and the first conductive layer (C) formed of the conductive substance.

The primer layer (B-1) may be formed on a portion of or entirety of a surface of the layer (A) including a support. The primer layer (B-1) may be formed on a single surface or both surfaces of the layer (A). The laminate may be, for example, a laminate in which the first primer layer (B-1) is formed on the entire surface of the layer (A) including a support, and the conductive layer (C) is formed only on a desired portion of the primer layer (B-1). Alternatively, the laminate may be a laminate in which the primer layer (B-1) is formed only on a portion of a surface of the layer (A) including a support, the portion being a portion above which the conductive layer (C) is to be formed.

The primer layer (B-1) preferably has a thickness in the range of 0.01 μm to 30 μm, more preferably in the range of 0.05 μm to 10 μm.

A laminate according to the present invention also includes the first conductive layer (C).

The first conductive layer (C) may be a monolayer formed of a conductive substance contained in the fluid (c-1), such as a conductive ink or a plating nucleating agent, or may be a layer that includes a first plating seed layer (C-1) formed of a conductive substance contained in the fluid (c-1) and a first plating layer (C-2) formed on the surface of the first plating seed layer (C-1).

The first conductive layer (C) is preferably the layer that includes the first plating seed layer (C-1) and the first plating layer (C-2) in order to obtain a laminate excellent in terms of, for example, resistance to humidity and heat.

The first plating seed layer (C-1) in the first conductive layer (C) is preferably formed of the conductive substance: specifically, it is preferably formed of silver. As described above, the first plating seed layer (C-1) is mainly formed of a conductive substance such as silver; however, a solvent, additives, and the like contained in the fluid (c-1) may remain in the first plating seed layer (C-1).

The first plating layer (C-2) in the first conductive layer (C) is a layer formed on the surface of the first plating seed layer (C-1). The first plating layer (C-2) is preferably a layer formed of at least one metal such as copper, nickel, chromium, cobalt, tin, or gold; more preferably, a plating layer formed of copper and a plating layer formed of nickel thereon constitute the first plating layer (C-2); still more preferably, a plating layer formed of copper, a plating layer formed of nickel thereon, and a plating layer formed of gold thereon constitute the first plating layer (C-2) in order to produce a conductive pattern with high reliability, such as a wiring pattern, in which good continuity can be maintained without causing disconnection or the like for a long period of time.

The conductive layer (C) may be formed on a portion of or entirety of the surface of the primer layer (B-1). Specifically, a conductive layer (C) formed only on a desired portion of the surface of the primer layer (B-1) may be a linear layer formed by forming a linear shape. A laminate that includes a linear layer as the conductive layer (C) is suitable for producing conductive patterns, electrical circuits, and the like.

In a case where the conductive layer (C) is linear, the linear layer preferably has a width (line width) of about 0.01 μm to about 200 μm, preferably 0.01 μm to 150 μm, more preferably 0.01 μm to 100 μm.

The first conductive layer (C) in a laminate according to the present invention preferably has a thickness in the range of 0.01 μm to 50 μm, more preferably in the range of 0.01 μm to 30 μm. The thickness of the conductive layer (C) can be adjusted by controlling, for example, the coating amount of the fluid (c-1) containing a conductive substance for forming the conductive layer (C). In a case where the conductive layer (C) has the shape of a fine line, its thickness (height) is preferably in the range of 0.01 μm to 1 μm.

The first plating seed layer (C-1) for forming the conductive layer (C) preferably has a thickness in the range of 0.01 μm to 25 μm. The thickness of the first plating seed layer (C-1) can be adjusted by controlling, for example, the coating amount of the fluid (c-1).

The first plating layer (C-2) preferably has a thickness in the range of 1 μm to 45 μm. The thickness of the first plating layer (C-2) can be adjusted by controlling, for example, treatment time, electric current density, or the amount of plating additives used during a plating step of forming the first plating layer (C-2).

A laminate according to the present invention also includes the insulating layer (D). The insulating layer (D) is formed for the purpose of preventing electrical connection between the first conductive layer (C) and the second conductive layer (E), and is generally referred to as an interlayer insulating material.

As the insulating layer (D), an insulating film or an insulating sheet formed so as to have the shape of a film or a sheet may be used. For example, insulating films or insulating sheets formed from resin compositions containing various resins or the like may be used.

Alternatively, instead of such a preformed film or sheet, the insulating layer (D) may be a layer formed by coating at least the surface of the first conductive layer (C) with a resin composition (d) and drying the resin composition (d).

The insulating layer (D) is preferably formed on a portion of or entirety of the surface of the first conductive layer (C). In a case where the first conductive layer (C) is formed on a portion of the surface of the first primer layer (B-1), the insulating layer (D) may be formed directly on the surface of the first primer layer (B-1).

The insulating layer (D) preferably has a thickness in the range of 1 μm to 50 μm in order to achieve insulation between the first conductive layer (C) and the second conductive layer (E) and also to achieve reduction in the thickness of the laminate. In a case where a preformed film or sheet is used as the insulating layer (D), the insulating layer (D) preferably has a thickness in the range of 5 μm to 40 μm from the standpoint of ease of handling. The film or sheet may be formed so as to have a tackiness layer or an adhesive layer. The above-described thickness does not include the thickness of the tackiness layer or adhesive layer and denotes the thickness of the film or sheet itself.

A laminate according to the present invention also includes the second primer layer (B-2).

The second primer layer (B-2) is a layer that receives a fluid (e-1) containing a conductive substance that can be used for forming the second conductive layer (E). Upon coming into contact with the fluid (e-1), the primer layer (B-2) quickly absorbs a solvent contained in the fluid (e-1) and holds the conductive substance on the surface of the primer layer (B-2).

This can considerably enhance resistance to humidity and heat and adhesion between the insulating layer (D), the primer layer (B-2), and the second conductive layer (E) formed of the conductive substance.

The primer layer (B-2) may be formed on a portion of or entirety of a surface of the insulating layer (D). The primer layer (B-2) may be formed on a single surface or both surfaces of the layer (D). The laminate may be, for example, a laminate in which the second primer layer (B-2) is formed on the entire surface of the insulating layer (D), and the second conductive layer (E) is formed only on a desired portion of the primer layer (B-2). Alternatively, the laminate may be a laminate in which the primer layer (B-2) is formed only on a portion of a surface of the insulating layer (D), the portion being a portion above which the second conductive layer (E) is to be formed.

The primer layer (B-2) preferably has a thickness in the range of 0.01 µm to 30 µm, more preferably in the range of 0.05 µm to 10 µm.

A laminate according to the present invention also includes the second conductive layer (E). The second conductive layer (E) includes a second plating seed layer (E-1) formed of a conductive substance contained in a fluid (e-1), such as a conductive ink or a plating nucleating agent, and a second plating layer (E-2) formed on the surface of the second plating seed layer (E-1).

The second plating seed layer (E-1) in the second conductive layer (E) is preferably formed of the conductive substance: specifically, it is preferably formed of silver. As described above, the second plating seed layer (E-1) is mainly formed of a conductive substance such as silver; however, a solvent and additives contained in the fluid (e-1) may remain in the second plating seed layer (E-1).

The second plating layer (E-2) in the second conductive layer (E) is a layer formed on the surface of the second plating seed layer (E-1). The second plating layer (E-2) is preferably a layer formed of at least one metal such as copper, nickel, chromium, cobalt, tin, or gold; more preferably, a plating layer formed of copper and a plating layer formed of nickel thereon constitute the second plating layer (E-2); still more preferably, a plating layer formed of copper, a plating layer formed of nickel thereon, and a plating layer formed of gold thereon constitute the second plating layer (E-2) in order to produce a conductive pattern with high reliability, such as a wiring pattern, in which good continuity can be maintained without causing disconnection or the like for a long period of time.

The second conductive layer (E) may be formed on a portion of or entirety of the surface of the second primer layer (B-2). Specifically, a conductive layer (E) formed only on a desired portion of the surface of the insulating layer (D) may be a linear layer formed by forming a linear shape. A laminate that includes a linear layer as the conductive layer (E) is suitable for producing conductive patterns, electrical circuits, and the like.

In a case where the second conductive layer (E) is linear, the linear layer preferably has a width (line width) of about 0.01 µm to about 200 µm, preferably 0.01 µm to 150 µm, more preferably 0.01 µm to 100 µm.

The second conductive layer (E) in a laminate according to the present invention preferably has a thickness in the range of 0.01 µm to 50 µm, more preferably in the range of 0.01 µm to 30 µm. The thickness of the second conductive layer (E) can be adjusted by controlling, for example, the coating amount of the fluid (e-1) for forming the second plating seed layer (E-1). In a case where the second conductive layer (E) has the shape of a fine line, its thickness (height) is preferably in the range of 0.01 µm to 1 µm.

The second plating seed layer (E-1) for forming the second conductive layer (E) preferably has a thickness in the range of 0.01 µm to 25 µm. The thickness of the second plating seed layer (E-1) can be adjusted by controlling, for example, the coating amount of the fluid (e-1).

The second plating layer (E-2) preferably has a thickness in the range of 1 µm to 45 µm. The thickness of the second plating layer (E-2) can be adjusted by controlling, for example, treatment time, electric current density, or the amount of plating additives used during a plating step of forming the second plating layer (E-2).

A laminate according to the present invention can be produced by, for example, a step [1] of coating a portion of or entirety of a surface of a support of the layer (A) with a primer for forming a first primer layer (B-1), and coating a portion of or entirety of the coated surface with a fluid (c-1) containing a conductive substance to provide a laminate of the layer (A) including the support, the first primer layer (B-1), and a first plating seed layer (C-1); a step [2] of plating a portion of or entirety of a surface of the first plating seed layer (C-1) to form a first conductive layer (C) in which a first plating layer (C-2) is formed on the surface of the first plating seed layer (C-1); a step [3] of placing an insulating-layer film or an insulating sheet on at least a portion of or entirety of a surface of the first plating layer (C-2), or coating at least a portion of or entirety of a surface of the first plating layer (C-2) with a resin composition (d) and drying the resin composition (d), to form an insulating layer (D); a step [4] of coating a portion of or entirety of the insulating layer (D) with a primer for forming a second primer layer (B-2) to provide a coated surface and coating a portion of or entirety of the coated surface with a fluid (e-1) containing a conductive substance to provide a laminate including the insulating layer (D), the second primer layer (B-2), and a second plating seed layer (E-1); and a step [5] of plating a portion of or entirety of a surface of the second plating seed layer (E-1) to form a second conductive layer (E) in which a second plating layer (E-2) is formed on the surface of the second plating seed layer (E-1).

The step [1] is a step of coating a portion of or entirety of a surface of a support of the layer (A) with a primer for forming the first primer layer (B-1), if necessary, drying the primer, subsequently coating a portion of or entirety of the coated surface with the fluid (c-1) containing a conductive substance and drying the fluid (c-1) to provide a laminate of the layer (A) including the support, the first primer layer (B-1), and the first conductive layer (C) or the first plating seed layer (C-1) for forming the first conductive layer (C).

Examples of the support of the layer (A) include supports formed of polyimide resins, polyamide-imide resins, polyamide resins, polyethylene terephthalate, polyethylene naphthalate, polycarbonate, acrylonitrile-butadiene-styrene (ABS), acrylic resins such as polymethyl(meth)acrylate, polyvinylidene fluoride, polyvinyl chloride, polyvinylidene chloride, polyvinyl alcohol, polycarbonate, polyethylene, polypropylene, polyurethane, cellulose nanofibers, silicon, ceramics, or glass; porous supports formed of the foregoing; and supports that are steel plates or formed of metals such as copper.

In particular, preferred examples of the above-described support are supports that are commonly used as supports for forming conductive patterns of circuit boards or the like, that is, supports formed of polyimide resins, polyethylene terephthalate, polyethylene naphthalate, glass, cellulose nanofibers, or the like.

In the cases of applications in which flexibility is required, for example, the support is preferably a support that is relatively flexible and, for example, can be bent in order to impart flexibility to the conductive pattern and to obtain the final product that can be bent. Specifically, a film- or sheet-shaped support formed by uniaxial drawing, for example, is preferably used.

Examples of the film- or sheet-shaped support include polyethylene terephthalate films, polyimide films, and polyethylene naphthalate films.

From the standpoint of achieving reduction in the weight and thickness of a laminate such as a conductive pattern and a final product including the laminate, the support preferably has a thickness of about 1 μm to about 2,000 μm, more preferably about 1 μm to about 100 μm. In a case where the laminate needs to be relatively flexible, the support preferably has a thickness of about 1 μm to about 80 μm.

As the primer used for coating a portion of or entirety of the surface of the support, primers containing various resins and solvents can be used.

Examples of the resins include a urethane resin (b1), a vinyl resin (b2), a urethane-vinyl composite resin (b3), a phenol resin, an epoxy resin, a melamine resin, a urea resin, an unsaturated polyester resin, an alkyd resin, a polyimide resin, and a fluororesin.

Of these resins, preferred is use of at least one resin selected from the group consisting of the urethane resin (b1), the vinyl resin (b2), and the urethane-vinyl composite resin (b3). More preferred is use of, as the urethane resin (b1), a urethane resin having a polycarbonate structure or a urethane resin having an aliphatic polyester structure; as the vinyl resin (b2), an acrylic resin having a structural unit derived from methyl methacrylate; and, as the urethane-vinyl composite resin (b3), a urethane-acrylic composite resin. Use of the urethane-acrylic composite resin is still more preferable because the adhesion and resistance to humidity and heat can be further enhanced and ion migration can be prevented.

The primer preferably contains 10% by mass to 70% by mass of the resin relative to the whole primer from the standpoint of maintaining easiness of coating, for example; more preferably contains 10% by mass to 50% by mass of the resin.

Examples of the solvents that can be used for the primer include various organic solvents and aqueous media.

Examples of the organic solvents include toluene, ethyl acetate, and methyl ethyl ketone. Examples of the aqueous media include water, organic solvents miscible with water, and mixtures of the foregoing.

Examples of the organic solvents miscible with water include alcohols such as methanol, ethanol, n- and isopropanol, ethyl carbitol, ethyl cellosolve, and butyl cellosolve; ketones such as acetone and methyl ethyl ketone; polyalkylene glycols such as ethylene glycol, diethylene glycol, and propylene glycol; alkyl ethers of polyalkylene glycols; and lactams such as N-methyl-2-pyrrolidone.

In the present invention, water alone may be used; or a mixture of water and an organic solvent miscible with water may be used; or an organic solvent miscible with water may be used alone.

In a case where an aqueous medium is used as the solvent, the resin is preferably a resin having a hydrophilic group in order to impart good water dispersibility to the primer and to enhance storage stability.

Examples of the hydrophilic group include anionic groups, cationic groups, and nonionic groups.

Examples of the anionic groups include a carboxyl group, a carboxylate group, a sulfonic group, and a sulfonate group. Of these, use of a carboxylate group or a sulfonate group formed by partial or entire neutralization with a basic compound or the like is preferred in order to impart good water dispersibility.

Examples of the basic compound that can be used for neutralizing the anionic group include organic amines such as ammonia, triethylamine, pyridine, and morpholine; alkanolamines such as monoethanolamine; and metal basic compounds containing sodium, potassium, lithium, calcium, or the like. In a case where a conductive pattern or the like is formed, the metal salt compounds may degrade conductivity or the like; accordingly, preferably used are the ammonia, organic amines, and alkanolamines.

In a case where the carboxylate group or the sulfonate group is used as the anionic group, the amount of such a group relative to the whole resin is preferably in the range of 50 mmol/kg to 2,000 mmol/kg in order to maintain good water dispersion stability of the resin.

Examples of the cationic group include tertiary amino groups.

Examples of acids that can be used for partial or entire neutralization of the tertiary amino groups include organic acids such as acetic acid, propionic acid, lactic acid, and maleic acid; organic sulfonic acids such as sulfonic acid and methanesulfonic acid; and inorganic acids such as hydrochloric acid, sulfuric acid, orthophosphoric acid, and orthophosphorous acid. These acids may be used alone or in combination of two or more thereof. In a case where a conductive pattern or the like is formed, chlorine, sulfur, and the like may degrade conductivity or the like and hence preferably used are acetic acid, propionic acid, lactic acid, maleic acid, and the like.

Examples of the nonionic groups include polyoxyalkylene groups such as a polyoxyethylene group, a polyoxypropylene group, a polyoxybutylene group, a poly(oxyethylene-oxypropylene) group, and a polyoxyethylene-polyoxypropylene group. Of these, use of a polyoxyalkylene group having an oxyethylene unit is preferred in order to further enhance hydrophilicity.

The urethane resin (b1) that can be used as a resin contained in the primer can be a urethane resin obtained by a reaction between a polyol, a polyisocyanate, and, if necessary, a chain extender. In particular, preferably used are urethane resins having a polycarbonate structure and urethane resins having an aliphatic polyester structure.

The polycarbonate structure and the aliphatic polyester structure are preferably structures derived from polyols used for production of the urethane resins. Specifically, the urethane resins having a polycarbonate structure can be produced with, as the polyols, polycarbonate polyols described later on. The urethane resins having an aliphatic polyester structure can be produced with, as the polyols, for example, aliphatic polyester polyols described later on.

As described above, examples of the polyol that can be used for production of the urethane resin (b1) include polycarbonate polyols and aliphatic polyester polyols. If necessary, the polyol may be used in combination with another polyol.

Examples of the polycarbonate polyols include a polycarbonate polyol obtained by a reaction between a carbonate and a polyol, and a polycarbonate polyol obtained by a reaction between phosgene and bisphenol A or the like.

Examples of the carbonate include methyl carbonate, dimethyl carbonate, ethyl carbonate, diethyl carbonate, cyclocarbonate, and diphenyl carbonate.

Examples of the polyol that can react with the carbonate include dihydroxy compounds having a relatively low molecular weight, such as ethylene glycol, diethylene glycol, triethylene glycol, 1,2-propylene glycol, 1,3-propylene glycol, dipropylene glycol, 1,4-butanediol, 1,3-butanediol, 1,2-butanediol, 2,3-butanediol, 1,5-pentanediol, 1,5-hexanediol, 2,5-hexanediol, 1,6-hexanediol, 1,7-heptanediol, 1,8-octanediol, 1,9-nonanediol, 1,10-decanediol, 1,11-undecanediol, 1,12-dodecanediol, 3-methyl-1,5-pentanediol, 2-ethyl-1,3-hexanediol, 2-methyl-1,3-propanediol, 2-methyl-1,8-octanediol, 2-butyl-2-ethylpropanediol, 2-methyl-1,8-octanediol, neopentyl glycol, hydroquinone, resorcin, bisphenol-A, bisphenol-F, and 4,4'-biphenol.

Examples of the aliphatic polyester polyols include an aliphatic polyester polyol obtained by subjecting a low-molecular-weight polyol and a polycarboxylic acid to an esterification reaction; an aliphatic polyester obtained by subjecting a cyclic ester compound such as ε-caprolactone or γ-butyrolactone to a ring-opening polymerization reaction; and a copolymer polyester of the foregoing.

Examples of the low-molecular-weight polyol that can be used for producing the polyester polyol include ethylene glycol, 1,2-propanediol, 1,3-butanediol, 1,4-butanediol, 1,6-hexanediol, 3-methyl-1,5-pentanediol, neopentyl glycol, diethylene glycol, dipropylene glycol, glycerin, and trimethylolpropane. These may be used alone or in combination of two or more thereof. Ethylene glycol, 1,2-propanediol, 1,3-butanediol, 1,4-butanediol, or the like is preferably used in combination with 3-methyl-1,5-pentanediol, neopentyl glycol, or the like.

Examples of the polycarboxylic acid include succinic acid, adipic acid, sebacic acid, dodecanedicarboxylic acid, azelaic acid, anhydrides of the foregoing, and ester-forming derivatives of the foregoing. Aliphatic polycarboxylic acids such as adipic acid are preferably used.

The polycarbonate polyols and the aliphatic polyester polyols preferably have a number-average molecular weight of 500 to 4,000, more preferably 500 to 2,000.

As the polyol that can be used for producing the urethane resin (b1), if necessary, the above-described polyol may be used in combination with another polyol.

Examples of the other polyol that can be appropriately used include ethylene glycol, 1,2-propanediol, 1,3-butanediol, 1,4-butanediol, 3-methyl-1,5-pentanediol, 1,6-hexanediol, 1,4-cyclohexanedimethanol, neopentyl glycol, diethylene glycol, dipropylene glycol, glycerin, trimethylolpropane; acrylic polyols in which hydroxy groups are introduced into acrylic copolymers; polybutadiene polyols that are butadiene copolymers intramolecularly containing hydroxy groups; hydrogenated polybutadiene polyols; and partially saponified ethylene-vinyl acetate copolymers.

Examples of the other polyol include polyols having an alicyclic structure and a relatively low molecular weight, such as 1,4-cyclohexanedimethanol, cyclobutanediol, cyclopentanediol, 1,4-cyclohexanediol, cycloheptanediol, cyclooctanediol, cyclohexanedimethanol, tricyclo[5.2.1.0$^{2,6}$]decanedimethanol, bicyclo[4.3.0]-nonanediol, dicyclohexanediol, tricyclo[5.3.1.1]dodecanediol, bicyclo[4.3.0]nonanedimethanol, tricyclo[5.3.1.1]dodecanediethanol, spiro[3.4]octanediol, butylcyclohexanediol, 1,1'-bicyclohexylidenediol, cyclohexanetriol, hydrogenated bisphenol A, and 1,3-adamantanediol.

In a case where a urethane resin having a hydrophilic group is produced as the urethane resin (b1), the other polyol is preferably a polyol having a hydrophilic group.

Examples of the polyol having a hydrophilic group include polyols having a carboxyl group such as 2,2-dimethylolpropionic acid, 2,2-dimethylolbutanoic acid, and 2,2-dimethylolvaleric acid; and polyols having a sulfonic group such as 5-sulfoisophthalic acid, sulfoterephthalic acid, 4-sulfophthalic acid, and 5-(4-sulfophenoxy)isophthalic acid. As the polyol having a hydrophilic group, for example, a polyester polyol having a hydrophilic group obtained by a reaction between the low-molecular-weight polyol having a hydrophilic group and various polycarboxylic acids such as adipic acid can also be used.

Examples of the polyisocyanate that can react with the polyol to generate a urethane resin include polyisocyanates having an aromatic structure such as 4,4'-diphenylmethane diisocyanate, 2,4'-diphenylmethane diisocyanate, carbodiimide-modified diphenylmethane diisocyanate, crude diphenylmethane diisocyanate, phenylene diisocyanate, tolylene diisocyanate, and naphthalene diisocyanate; and aliphatic polyisocyanates and polyisocyanates having an alicyclic structure, such as hexamethylene diisocyanate, lysine diisocyanate, cyclohexane diisocyanate, isophorone diisocyanate, dicyclohexylmethane diisocyanate, xylylene diisocyanate, and tetramethylxylylene diisocyanate.

Examples of the chain extender that can be used during production of the urethane resin include polyamines, hydrazine compounds, and other active-hydrogen-atom-containing compounds.

Examples of the polyamines include diamines such as ethylenediamine, 1,2-propanediamine, 1,6-hexamethylenediamine, piperazine, 2,5-dimethylpiperazine, isophoronediamine, 4,4'-dicyclohexylmethanediamine, 3,3'-dimethyl-4,4'-dicyclohexylmethanediamine, and 1,4-cyclohexanediamine; N-hydroxymethylaminoethylamine, N-hydroxyethylaminoethylamine, N-hydroxypropylaminopropylamine, N-ethylaminoethylamine, N-methylaminopropylamine; diethylenetriamine, dipropylenetriamine, and triethylenetetramine.

Examples of the hydrazine compounds include hydrazine, N,N'-dimethylhydrazine, 1,6-hexamethylenebishydrazine; succinic acid dihydrazide, adipic acid dihydrazide, glutaric acid dihydrazide, sebacic acid dihydrazide, isophthalic acid dihydrazide; β-semicarbazide propionic acid hydrazide, 3-semicarbazide-propyl-carbazic acid ester, and semicarbazide-3-semicarbazidemethyl-3,5,5-trimethylcyclohexane.

Examples of the other active-hydrogen-containing compounds include glycols such as ethylene glycol, diethylene glycol, triethylene glycol, propylene glycol, 1,3-propanediol, 1,3-butanediol, 1,4-butanediol, hexamethylene glycol, saccharose, methylene glycol, glycerin, and sorbitol; phenols such as bisphenol A, 4,4'-dihydroxydiphenyl, 4,4'-dihydroxydiphenyl ether, 4,4'-dihydroxydiphenyl sulfone, hydrogenated bisphenol A, and hydroquinone; and water.

The chain extender is preferably used such that, for example, the equivalent ratio between the amino groups of the polyamine and excessive isocyanato groups is in the range of 1.9 or less (equivalent ratio), more preferably in the range of 0.3 to 1 (equivalent ratio).

The urethane resin (b1) can be produced by, for example, in the absence of solvent or in the presence of an organic solvent, causing a reaction between the polyol, the polyisocyanate, and, if necessary, the chain extender by a known method.

The reaction between the polyol and the polyisocyanate can be performed, with great care on rapid generation of heat, rapid foaming, and the like from the standpoint of safety, preferably at a reaction temperature of 50° C. to 120° C., more preferably 80° C. to 100° C.: the polyol and the polyisocyanate are mixed together at one time, or one of the polyol and the polyisocyanate is successively supplied to the other by dropping or the like, to cause the reaction for about 1 hour to about 15 hours.

Regarding a primer containing an aqueous dispersion of the urethane resin (b1), the polyol, the polyisocyanate, and, if necessary, a chain extender are caused to react by the above-described method to produce the urethane resin (b1); if necessary, for example, the hydrophilic groups of the urethane resin (b1) such as anionic groups are partially or entirely neutralized; the urethane resin (b1) is then mixed with an aqueous medium used as a solvent of the primer, to thereby provide the primer containing a urethane resin (b1)-aqueous dispersion in which the urethane resin (b1) is dispersed or partially dissolved in the aqueous medium.

More specifically, the polyol and the polyisocyanate are caused to react by the above-described method to thereby produce a urethane prepolymer having an end isocyanato group; if necessary, for example, the hydrophilic groups of the urethane prepolymer such as anionic groups are partially or entirely neutralized; the urethane prepolymer is then mixed with the aqueous medium; and, if necessary, the chain extender is used to extend the chain. As a result, a primer containing a urethane resin (b1)-aqueous dispersion in which the urethane resin (b1) is dispersed or dissolved in the aqueous medium can be obtained.

The reaction between the polyisocyanate and the polyol is preferably caused such that, for example, the equivalent ratio of isocyanato groups of the polyisocyanate to hydroxy groups of the polyol [isocyanato groups/hydroxy groups] is in the range of 0.9 to 2.

During production of the urethane resin (b1), as described above, the solvent used may be an organic solvent. Examples of the organic solvent include ketones such as acetone and methyl ethyl ketone; ethers such as tetrahydrofuran and dioxane; acetates such as ethyl acetate and butyl acetate; nitriles such as acetonitrile; and amides such as dimethylformamide and N-methylpyrrolidone. These solvents may be used alone or in combination of two or more thereof. The organic solvent is preferably removed by distillation or the like after production of the urethane resin (b1). However, in the case of using the primer containing the urethane resin (b1) and an organic solvent, the organic solvent used during production of the urethane resin (b1) may be used as the solvent of the primer.

In order to form a laminate such as a conductive pattern being excellent in terms of the adhesion and conductivity, the urethane resin (b1) preferably has a weight-average molecular weight of 5,000 to 500,000, more preferably 20,000 to 100,000.

If necessary, the urethane resin (b1) may have various functional groups. Examples of the functional groups include cross-linkable functional groups such as alkoxy silyl groups, a silanol group, a hydroxy group, and an amino group.

Such a cross-linkable functional group can be suitably used to form a cross-linked structure in the primer layer (B) to thereby allow formation of a conductive layer or a plating layer with high durability.

The alkoxy silyl group or the silanol group can be introduced into the urethane resin by using γ-aminopropyltriethoxysilane or the like during production of the urethane resin (b1).

In a case where the urethane resin (b1) is used in combination with a cross-linking agent described later on, the urethane resin (b1) may have a functional group that can react with a functional group of the cross-linking agent. Although the functional group used depends on the selected cross-linking agent used in combination, in a case where a cross-linking agent such as a blocked isocyanate compound is used, the functional group may be a hydroxy group or an amino group.

As the vinyl resin (b2) that can be used as a resin contained in the primer, a polymer of a monomer having a polymerizable unsaturated double bond can be used. Specifically, examples include polyethylene, polypropylene, polybutadiene, ethylene-propylene copolymers, natural rubber, synthetic isoprylene rubber, ethylene-vinyl acetate copolymers, and acrylic resins. Acrylic resins having a structural unit derived from methyl methacrylate are preferably used.

The acrylic resins may be polymers and copolymers obtained by polymerizing (meth)acrylic monomers. Note that a (meth)acrylic monomer denotes one or both of an acrylic monomer and a methacrylic monomer.

The acrylic resins are preferably acrylic resins having a structural unit derived from methyl(meth)acrylate.

The acrylic resins can be produced by polymerizing, for example, various (meth)acrylic monomers described below.

Examples of the (meth)acrylic monomers include (meth)acrylates such as methyl (meth)acrylate, ethyl (meth)acrylate, n-butyl (meth)acrylate, i-butyl (meth)acrylate, t-butyl (meth)acrylate, 2-ethylhexyl (meth)acrylate, hexyl (meth)acrylate, cyclohexyl (meth)acrylate, octyl (meth)acrylate, nonyl (meth)acrylate, dodecyl (meth)acrylate, stearyl (meth)acrylate, isobornyl (meth)acrylate, dicyclopentanyl (meth)acrylate, phenyl (meth)acrylate, and benzyl (meth)acrylate; and alkyl (meth)acrylates such as 2,2,2-trifluoroethyl (meth)acrylate, 2,2,3,3-pentafluoropropyl (meth)acrylate, perfluorocyclohexyl (meth)acrylate, 2,2,3,3,-tetrafluoropropyl (meth)acrylate, and β-(perfluorooctyl)ethyl (meth)acrylate.

Among those described above, methyl methacrylate is preferably used in order to achieve high adhesion between the primer layer (B) and the layer (A) including a support without being affected by, for example, heat in a heating step during production of a conductive pattern. Also, the methyl methacrylate is more preferably used in order to allow printing of fine lines without blurring (enhancement of fine-line formability), the fine lines being required to have a width of about 0.01 μm to about 200 μm, preferably about 0.01 μm to about 150 μm, during formation of conductive patterns for electronic circuits and the like.

Together with the methyl methacrylate, an alkyl (meth)acrylate having an alkyl group having 2 to 12 carbon atoms is preferably used; an alkyl acrylate having an alkyl group having 3 to 8 carbon atoms is more preferably used; and n-butyl acrylate is preferably used in order to achieve further enhancement in the adhesion and conductivity. This is also preferred in order to form a conductive pattern that does not have blurring or the like and is excellent in terms of fine-line formability.

The amount of the methyl (meth)acrylate relative to the whole amount of the mixture of (meth)acrylic monomers is preferably 10% by mass to 70% by mass, more preferably 30% by mass to 65% by mass; and the amount of the alkyl acrylate having an alkyl group having 2 to 12 carbon atoms, preferably the alkyl acrylate having an alkyl group having 3 to 8 carbon atoms, relative to the whole amount of the mixture of (meth)acrylic monomers is preferably 20% by mass to 80% by mass, more preferably 35% by mass to 70% by mass.

The (meth)acrylic monomers that can be used for producing the acrylic resins may be, other than those described above, carboxyl-group-containing vinyl monomers such as acrylic acid, methacrylic acid, β-carboxyethyl (meth)acrylate, 2-(meth)acryloylpropionic acid, crotonic acid, itaconic acid, maleic acid, fumaric acid, itaconic acid half ester, maleic acid half ester, maleic anhydride, itaconic anhydride, and β-(meth)acryloyloxyethyl hydrogen succinate. These carboxyl-group-containing vinyl monomers may be neutralized with ammonia, potassium hydroxide, or the like.

The (meth)acrylic monomers may be cross-linkable-functional-group-containing vinyl monomers from the standpoint of introducing, into the acrylic resins, the cross-linkable functional group such as at least one amide group selected from the group consisting of a methylolamide group and an alkoxymethylamide group, other amide groups, a hydroxy group, a glycidyl group, an amino group, a silyl group, an aziridinyl group, an isocyanato group, an oxazoline group, a cyclopentenyl group, an allyl group, a carbonyl group, or an acetoacetyl group.

Examples of the vinyl monomer that has at least one amide group selected from the group consisting of a methylolamide group and an alkoxymethylamide group and that can be used as the (meth)acrylic monomer having a cross-linkable functional group, include N-methylol(meth)acrylamide, N-methoxymethyl(meth)acrylamide, N-ethoxymethyl(meth)acrylamide, N-propoxymethyl(meth)acrylamide, N-isopropoxymethyl(meth)acrylamide, N-n-butoxymethyl (meth)acrylamide, N-isobutoxymethyl(meth)acrylamide, N-pentoxymethyl(meth)acrylamide, N-ethoxymethyl-N-methoxymethyl(meth)acrylamide, N,N'-dimethylol(meth) acrylamide, N-ethoxymethyl-N-propoxymethyl(meth)acrylamide, N,N'-dipropoxymethyl(meth)acrylamide, N-butoxymethyl-N-propoxymethyl(meth)acrylamide, N,N-dibutoxymethyl(meth)acrylamide, N-butoxymethyl-N-methoxymethyl(meth)acrylamide, N,N'-dipentoxymethyl (meth)acrylamide, and N-methoxymethyl-N-pentoxymethyl (meth)acrylamide.

Of these, N-n-butoxymethyl(meth)acrylamide and N-isobutoxymethyl(meth)acrylamide are preferably used in order to form a conductive pattern with, for example, durability that allows prevention of separation of the conductive substance (a2) during the plating step.

Examples of the (meth)acrylic monomers having a cross-linkable functional group include, in addition to those described above, vinyl monomers having an amide group such as (meth)acrylamide, vinyl monomers having a hydroxy group such as 2-hydroxyethyl (meth)acrylate, 2-hydroxypropyl (meth)acrylate, 2-hydroxybutyl (meth)acrylate, 4-hydroxybutyl (meth)acrylate, 6-hydroxyhexyl (meth)acrylate, (4-hydroxymethylcyclohexyl)methyl (meth)acrylate, glycerol (meth)acrylate, polyethylene glycol (meth)acrylate, and N-hydroxyethyl(meth)acrylamide: polymerizable monomers having a glycidyl group such as glycidyl (meth)acrylate and allyl (meth)acrylic acid glycidyl ether; polymerizable monomers having an amino group such as aminoethyl (meth) acrylate, dimethylaminoethyl (meth)acrylate, N-monoalkylaminoalkyl (meth)acrylate, and N,N-dialkylaminoalkyl (meth)acrylate; polymerizable monomers having a silyl group such as vinyltrichlorosilane, vinyltrimethoxysilane, vinyltriethoxysilane, vinyltris(β-methoxyethoxy)silane, γ-(meth)acryloxypropyltrimethoxysilane, γ-(meth)acryloxypropyltriethoxysilane, γ-(meth)acryloxypropylmethyldimethoxysilane, γ-(meth)acryloxypropylmethyldiethoxysilane, γ-(meth)acryloxypropyltriisopropoxysilane, N-β-(N-vinylbenzylaminoethyl)-γ-aminopropyltrimethoxysilane, and hydrochlorides of the foregoing; polymerizable monomers having an aziridinyl group such as 2-aziridinylethyl (meth)acrylate; polymerizable monomers having an isocyanato group and/or blocked isocyanato groups such as (meth) acryloyl isocyanate and phenol or methyl ethyl ketoxime adducts of (meth)acryloyl isocyanatoethyl; polymerizable monomers having an oxazoline group such as 2-isopropenyl-2-oxazoline and 2-vinyl-2-oxazoline; polymerizable monomers having a cyclopentenyl group such as dicyclopentenyl (meth)acrylate; polymerizable monomers having an allyl group such as allyl (meth)acrylate; and polymerizable monomers having a carbonyl group such as acrolein and diacetone (meth)acrylamide.

The amount of the (meth)acrylic monomers having a cross-linkable functional group relative to the whole amount of the mixture of (meth)acrylic monomers may be in the range of 0% by mass to 50% by mass.

Among the (meth)acrylic monomers having a cross-linkable functional group, the amount of the (meth)acrylic monomers having an amide group relative to the whole amount of the mixture of (meth)acrylic monomers is preferably, from the standpoint of introducing a self-cross-linkable methylolamide group or the like, in the range of 0.1% by mass to 50% by mass, more preferably in the range of 1% by mass to 30% by mass. The amount of a (meth)acrylic monomer having another amide group and a (meth)acrylic monomer having a hydroxy group that are used in combination with the self-cross-linkable methylolamide group, relative to the whole amount of the (meth)acrylic monomers, is preferably in the range of 0.1% by mass to 30% by mass, more preferably in the range of 1% by mass to 20% by mass.

Among the (meth)acrylic monomers having a cross-linkable functional group, the amount of the (meth)acrylic monomer having a hydroxy group or the (meth)acrylic monomer having an acid group depends on, for example, the type of the cross-linking agent (D) used in combination, but this amount relative to the whole amount of the mixture of (meth)acrylic monomers is preferably in the range of about 0.05% by mass to about 50% by mass, preferably in the range of 0.05% by mass to 30% by mass, more preferably 0.1% by mass to 10% by mass.

During production of the acrylic resin, the (meth)acrylic monomers may be used in combination with, for example, vinyl acetate, vinyl propionate, vinyl butyrate, Versatic acid vinyl ester, methyl vinyl ether, ethyl vinyl ether, propyl vinyl ether, butyl vinyl ether, amyl vinyl ether, hexyl vinyl ether, (meth)acrylonitrile, styrene, α-methylstyrene, vinyltoluene, vinylanisole, α-halostyrene, vinylnaphthalene, divinylstyrene, isoprene, chloroprene, butadiene, ethylene, tetrafluoroethylene, vinylidene fluoride, N-vinylpyrrolidone, polyethylene glycol mono(meth)acrylate, glycerol mono(meth) acrylate, vinylsulfonic acid, styrenesulfonic acid, allylsulfonic acid, 2-methylallylsulfonic acid, 2-sulfoethyl (meth)acrylate, 2-sulfopropyl (meth)acrylate, "ADEKA REASOAP PP-70 or PPE-710" (manufactured by ADEKA CORPORATION), or salts of the foregoing.

The acrylic resin can be produced by polymerizing a mixture of the above-described various vinyl monomers in accordance with known methods. In order to produce a conductive pattern excellent in terms of adhesion and conductivity, an emulsion polymerization method is preferably employed.

Examples of the emulsion polymerization method include a method in which water, a mixture of (meth)acrylic monomers, a polymerization initiator, and, if necessary, a chain transfer agent, an emulsifying agent, a dispersion stabilizing agent, or the like are supplied into a reaction vessel at one time and mixed to cause polymerization; a monomer dropping method of dropping a mixture of (meth)acrylic monomers into a reaction vessel to cause polymerization; and a pre-emulsion method in which a mixture of (meth)acrylic monomers, an emulsifying agent, and the like, and water are mixed in advance and dropped into a reaction vessel to cause polymerization.

The reaction temperature in the emulsion polymerization method varies depending on the types of (meth)acrylic monomers and polymerization initiator used. However, the reaction temperature is preferably, for example, about 30° C. to about 90° C. and the reaction time is preferably, for example, about 1 hour to about 10 hours.

Examples of the polymerization initiator include persulfates such as potassium persulfate, sodium persulfate, and ammonium persulfate; organic peroxides such as benzoyl peroxide, cumene hydroperoxide, and t-butyl hydroperoxide; and hydrogen peroxide. Such a peroxide alone may be used to cause radical polymerization. Alternatively, polymerization can be caused by a redox polymerization initiator system in which such a peroxide is used in combination with a reducing agent such as ascorbic acid, erythorbic acid, sodium erythorbate, a metal salt of formaldehyde sulfoxylate, sodium thiosulfate, sodium bisulfite, or iron(II) chloride. Azo initiators such as 4,4'-azobis(4-cyanovaleric acid) and 2,2'-azobis(2-amidinopropane)dihydrochloride can also be used. These compounds may be used alone or in combination of two or more thereof.

Examples of the emulsifying agent that can be used for producing the acrylic resin include anionic surfactants, nonionic surfactants, cationic surfactants, and amphoteric surfactants.

Examples of the anionic surfactants include higher-alcohol sulfuric acid esters and salts thereof, alkylbenzenesulfonic acid salts, polyoxyethylene alkylphenylsulfonic acid salts, polyoxyethylene alkyldiphenyl ether sulfonic acid salts, sulfuric acid half ester salts of polyoxyethylene alkyl ethers, alkyldiphenyl ether disulfonic acid salts, and succinic acid dialkyl ester sulfonic acid salts. Examples of the nonionic surfactants include polyoxyethylene alkyl ethers, polyoxyethylene alkylphenyl ethers, polyoxyethylene diphenyl ether, polyoxyethylene-polyoxypropylene block copolymers, and acetylenediol-based surfactants.

Examples of the cationic surfactants include alkyl ammonium salts.

Examples of the amphoteric surfactants include alkyl(amido) betaines and alkyldimethylamine oxides.

Examples of the emulsifying agent include, in addition to the above-described surfactants, fluorine-based surfactants, silicone-based surfactants, and emulsifying agents that intramolecularly have a polymerizable unsaturated group and are generally referred to as "reactive emulsifying agents".

Examples of the reactive emulsifying agents include "LATEMUL S-180" (manufactured by Kao Corporation) and "ELEMINOL JS-2 and RS-30" (manufactured by Sanyo Chemical Industries, Ltd.), which have a sulfonic group and a salt thereof; "AQUALON HS-10, HS-20, and KH-1025" (manufactured by DAI-ICHI KOGYO SEIYAKU CO., LTD.) and "ADEKA REASOAP SE-10 and SE-20" (manufactured by ADEKA CORPORATION), which have a sulfate group and a salt thereof; "NEW FRONTIER A-229E" (manufactured by DAI-ICHI KOGYO SEIYAKU CO., LTD.) which has a phosphate group; and "AQUALON RN-10, RN-20, RN-30, and RN-50" (manufactured by DAI-ICHI KOGYO SEIYAKU CO., LTD.), which have a nonionic hydrophilic group.

Examples of the chain transfer agent that can be used for producing the acrylic resin (x2-1) include lauryl mercaptan. The amount of the chain transfer agent relative to the whole amount of the mixture of (meth)acrylic monomers is preferably in the range of 0% by mass to 1.0% by mass, more preferably in the range of 0% by mass to 0.5% by mass.

Examples of the urethane-vinyl composite resin (b3) that can be used as a resin contained in the primer include composite resin particles that are formed of a urethane resin (b3-1) and a vinyl polymer (b3-2) and can be dispersed in aqueous media, for example.

Specifically, the composite resin particles are resin particles that are formed of the urethane resin (b3-1) and contain therein a portion of or entirety of the vinyl polymer (b3-2). In the case of forming a conductive pattern, the core-shell-type composite resin particles not requiring use of surfactants and the like that can degrade electrical characteristics are preferably used. In the composite resin particles, it is preferable that the vinyl polymer (b3-2) be substantially completely covered with the urethane resin (b3-1); however, this is not mandatory and a portion of the vinyl polymer (b3-2) may be present in the outermost portions of the composite resin particles as long as advantages of the present invention are not degraded.

Regarding the composite resin particles, in a case where the vinyl polymer (b3-2) is more hydrophilic than the urethane resin (b3-1), the composite resin particles may be formed such that a portion of or entirety of the urethane resin (b3-1) is present within the resin particles formed of the vinyl polymer (b3-2).

The urethane resin (b3-1) and the vinyl polymer (b3-2), which may form covalent bonds therebetween, preferably do not form bonds therebetween.

The urethane-vinyl composite resin (b3) is preferably a urethane-acrylic composite resin in which the vinyl polymer (b3-2) is an acrylic resin.

The composite resin particles preferably have an average particle size in the range of 5 nm to 100 nm from the standpoint of maintaining good water dispersion stability. This average particle size denotes an average particle size based on volume and measured by a dynamic light scattering method.

The urethane-vinyl composite resin (b3) preferably contains the urethane resin (b3-1) and the vinyl polymer (b3-2) such that [urethane resin (b3-1)/vinyl polymer (b3-2)]=90/10 to 10/90, more preferably 70/30 to 10/90.

The urethane resin (b3-1) of the urethane-vinyl composite resin (b3) may be the same resin as the urethane resin (b1). Examples of the urethane resin (b3-1) of the urethane-vinyl composite resin include, in addition to the above-described examples of the urethane resin (b1), urethane resins having a polyether structure and urethane resins having an aromatic polyester structure.

As the urethane resin (b3-1) that can be used for producing the urethane-vinyl composite resin (b3), preferably used is a urethane resin having 2,000 mmol/kg to 5,500 mmol/kg of an alicyclic structure and a hydrophilic group, and more preferably used is a urethane resin having 3,000 mmol/kg to 5,000 mmol/kg of an alicyclic structure in order to further enhance the adhesion and resistance to humidity and heat, to prevent separation of the primer layer (B) from the support in the plating step and to enhance the durability.

The polyol, the polyisocyanate, and the chain extender that can be used for producing the urethane resin (b3-1) may be the same as the above-described examples of the polyol, the polyisocyanate, and the chain extender that can be used for producing the urethane resin (b1).

In a case where the urethane resin (b3-1) that has the predetermined amount of an alicyclic structure is used, the polyol and the polyisocyanate preferably selected and used are a polyol having an alicyclic structure and a polyisocyanate having an alicyclic structure.

The urethane resin having a polyether structure can be produced by using, as the polyol, a polyetherpolyol described below, for example.

The polyetherpolyol may be obtained by, for example, subjecting alkylene oxide to addition polymerization by using, as an initiator, one or two or more compounds having two or more active hydrogen atoms.

Examples of the initiator include ethylene glycol, diethylene glycol, triethylene glycol, propylene glycol, trimethylene glycol, 1,3-butanediol, 1,4-butanediol, 1,6-hexanediol, neopentyl glycol, glycerin, trimethylolethane, and trimethylolpropane.

Examples of the alkylene oxide include ethylene oxide, propylene oxide, butylene oxide, styrene oxide, epichlorohydrin, and tetrahydrofuran.

In a case where the urethane resin having an aromatic polyester structure is used, as the polyol, an aromatic polyester polyol may be used.

The aromatic polyester polyol may be obtained by, for example, subjecting a low-molecular-weight polyol and an aromatic polycarboxylic acid to an esterification reaction.

Examples of the low-molecular-weight polyol that can be used for producing the aromatic polyester polyol include ethylene glycol, 1,2-propanediol, 1,3-butanediol, 1,4-butanediol, 1,6-hexanediol, 3-methyl-1,5-pentanediol, neopentyl glycol, diethylene glycol, dipropylene glycol, glycerin, and trimethylolpropane. These polyols may be used alone or in combination of two or more thereof. Ethylene glycol, 1,2-propanediol, 1,3-butanediol, 1,4-butanediol, or the like is preferably used in combination with 3-methyl-1,5-pentanediol, neopentyl glycol, or the like.

Examples of the aromatic polycarboxylic acid include terephthalic acid, isophthalic acid, phthalic acid, naphthalene dicarboxylic acid, anhydrides of the foregoing, and esterified compounds of the foregoing.

The polyetherpolyol and the aromatic polyester polyol preferably have a number-average molecular weight of 500 to 4,000, more preferably 500 to 2,000.

The vinyl polymer (b3-2) of the urethane-vinyl composite resin preferably has a glass transition temperature of 10° C. to 70° C. in order to enhance adhesion to the conductive layer (C). Note that the value of the glass transition temperature of the vinyl polymer (x3-2) is determined by calculation mainly on the basis of the composition of the vinyl monomer used for producing the vinyl polymer (b3-2). Specifically, vinyl polymers (b3-2) described later on are used in combination, to thereby provide the vinyl polymer (b3-2) having the predetermined glass transition temperature.

The vinyl polymer (b3-2) preferably has a weight-average molecular weight of 800,000 or more, more preferably 1,000,000 or more, in order to enhance adhesion to the conductive layer (C) and the conductivity of the resultant conductive pattern and to achieve reduction in the line width of the pattern.

The upper limit of the weight-average molecular weight of the vinyl polymer (b3-2) is not particularly limited; and, in general, it is preferably 10,000,000 or less, preferably 5,000,000 or less.

If necessary, the vinyl polymer (b3-2) may have various functional groups. Examples of the functional groups include cross-linkable functional groups such as an amide group, a hydroxy group, a glycidyl group, an amino group, a silyl group, an aziridinyl group, an isocyanato group, an oxazoline group, a cyclopentenyl group, an allyl group, a carboxyl group, and acetoacetyl group.

The vinyl polymer (b3-2) may be the same polymer as the vinyl polymer (b3). Specifically, (meth)vinyl monomers that can be used for producing the vinyl polymer (b3-2) may be the same monomers as the vinyl monomers described as examples that can be used for producing the vinyl resin (b3), preferably the same monomers as the (meth)acrylic monomers. In particular, the vinyl polymer (b3-2) is preferably the same as the acrylic resin having a structural unit derived from methyl methacrylate and described as an example that can be used as the vinyl resin (x2).

The urethane-vinyl composite resin (b3) can be produced by, for example, a step (V) of producing an aqueous dispersion of the urethane resin (b3-1) by causing a reaction between the polyisocyanate, the polyol, and, if necessary, a chain extender and forming an aqueous dispersion; and a step (W) of producing the vinyl polymer (b3-2) by polymerizing the (meth)acrylic monomer in the aqueous dispersion.

Specifically, in the absence of solvent or in the presence of an organic solvent or in the presence of a reactive diluent such as a (meth)acrylic monomer, a reaction between the polyisocyanate and the polyol is caused to obtain the urethane resin (b3-1). Subsequently, if necessary, the hydrophilic groups of the urethane resin (b3-1) are partially or entirely neutralized with a basic compound or the like. If necessary, the urethane resin (b3-1) is further caused to react with a chain extender and dispersed in an aqueous medium. Thus, the aqueous dispersion of the urethane resin (b3-1) is produced.

Subsequently, into the obtained aqueous dispersion of the urethane resin (b3-1), a vinyl monomer such as the (meth)acrylic monomer is supplied. The vinyl monomer is subjected to radical polymerization within the urethane resin (b3-1) particles to produce the vinyl resin (b3-2). In a case where the urethane resin (b3-1) is produced in the presence of a vinyl monomer, after the production of the urethane resin (b3-1), a polymerization initiator or the like is supplied to cause radical polymerization of the vinyl monomer such as the (meth)acrylic monomer, so that the vinyl resin (b3-2) is produced.

The above-described procedures allow production of a primer containing composite resin particles in which the urethane resin (b3-1) particles contain a portion of or entirety of the vinyl resin (b3-2), the composite resin particles being dispersed in an aqueous medium.

During production of the composite resin particles, in a case where the urethane resin (b3-1) has a high viscosity and is not suitable for the production, a standard organic solvent such as methyl ethyl ketone, N-methylpyrrolidone, acetone, or dipropylene glycol dimethyl ether or a reactive diluent can be used. In particular, the reactive diluent is preferably a vinyl monomer such as a (meth)acrylic monomer that can be used for producing the vinyl polymer (b3-2) because a solvent removal step can be omitted to increase the production efficiency of the primer.

Examples of the resin that can be used for the primer include, in addition to those described above, phenol resins, epoxy resins, melamine resins, urea resins, unsaturated polyester resins, alkyd resins, polyimide resins, and fluororesins.

The above-described resins that can be used for the primer may be appropriately used in combination. For example, two or more among the urethane resin (b1), the vinyl resin (b2), and the urethane-vinyl composite resin (b3) can be appropriately used in combination. As the urethane resin (b1), a urethane resin having a polyether structure and a urethane resin having a polycarbonate structure can be used in combination.

As the primer, the urethane resin (b1) and the vinyl resin (b2) can be used in combination. In the case of employing this combination, the urethane resin (b1) and the vinyl resin (b2) are preferably contained so as to satisfy [(b1)/(b2)]=90/10 to 10/90, and preferably used so as to satisfy 70/30 to 10/90.

As a resin contained in the primer, as described above, a resin having a cross-linkable functional group can be used.

The cross-linkable functional group is preferably used in order to form a cross-linked structure within the first primer layer (B-1), to thereby allow formation of, without causing blurring or the like, a conductive layer (C) excellent in terms of adhesion or conductivity or the first plating seed layer (C-1) for forming the conductive layer (C).

Examples of the cross-linkable functional group include alkoxy silyl groups, a silanol group, an amino group, and a hydroxy group.

In a case where the resin having an alkoxy silyl group or a silanol group is used, the alkoxy silyl group or the silanol group undergoes hydrolytic condensation within the aqueous medium that is the solvent of the primer to form a cross-linked structure. The primer having the cross-linked structure is applied to a surface of a support and subjected to drying or the like. Thus, the first primer layer (B-1) having the cross-linked structure is formed prior to coating with the fluid (c-1) for forming the conductive layer (C) or the first plating seed layer (C-1) for forming the conductive layer (C).

The cross-linkable functional group may be a cross-linkable functional group that can form the cross-linked structure through, upon heating at about 100° C. or more, preferably at 120° C. or more, a cross-linking reaction between the cross-linkable functional groups or with, for example, a cross-linking agent described later on. Specifically, preferably used is at least one thermally cross-linkable functional group selected from the group consisting of a methylolamide group and an alkoxymethylamide group.

Specific examples of the alkoxymethylamide group include amide groups in which, for example, a methoxymethyl group, an ethoxymethyl group, a propoxymethyl group, or a butoxymethyl group is bonded to the nitrogen atom. In particular, it is preferable to use a resin having at least one selected from the group consisting of a methylolamide group and an alkoxymethylamide group in order to considerably enhance the durability of the first primer layer (B-1) or adhesion to various supports.

In the case of using such a primer containing a resin having a functional group that can cause a cross-linking reaction upon heating at about 100° C. or more, preferably at about 120° C., the primer applied to a surface of the support is preferably dried at a temperature less than 100° C. In this case, a primer layer that substantially does not have a cross-linked structure can be formed.

The primer layer not having a cross-linked structure is coated (by printing) with the fluid (c-1) and subsequently, at 100° C. or more, subjected to a heating step or heating or the like carried out aside from the heating step, so that a primer layer having a cross-linked structure can be formed.

In this way, the fluid (c-1) is applied and subsequently a cross-linked structure is formed within the first primer layer (B-1) to thereby form a conductive pattern that has markedly high durability: in a plating step described later on, even exposure to a plating agent composed of a strongly alkaline or strongly acidic substance does not cause separation of the first primer layer (B-1) from the support. Note that the phrase "substantially does not have a cross-linked structure" encompasses a case where the cross-linked structure is not formed at all and also a case where the cross-linked structure is partially formed by about 5% or less of the number of functional groups that can form the cross-linked structure.

The total amount of the cross-linkable functional group contained relative to the total resin amount in the primer can be in the range of 0.005 equivalent/kg to 1.5 equivalent/kg.

If necessary, the primer can be used so as to appropriately contain publicly known agents such as a cross-linking agent, a pH adjusting agent, a film-formation agent, a leveling agent, a thickener, a water repellent agent, and a defoaming agent as long as advantages of the present invention are not degraded.

Examples of the cross-linking agent include thermal cross-linking agents (x1-1) that can react at relatively low temperatures of about 25° C. to less than about 100° C. to form cross-linked structures, such as metal chelate compounds, polyamine compounds, aziridine compounds, metallic salt compounds, and isocyanate compounds; thermal cross-linking agents (x1-2) that can react at relatively high temperatures of about 100° C. or more to form cross-linked structures, such as one or more selected from the group consisting of melamine compounds, epoxy compounds, oxazoline compounds, carbodiimide compounds, and blocked isocyanate compounds; and various photo-cross-linking agents.

In the case of using a primer containing the thermal cross-linking agent (x1-1), for example, the primer is applied to a surface of a support and dried at a relatively low temperature; subsequently the fluid (c-1) is applied (by printing); and then heating at a temperature less than 100° C. is performed to form a cross-linked structure. As a result, a conductive pattern having markedly high durability can be formed: loss of the conductive substance due to exposure to heat or external force for a long period of time can be prevented.

On the other hand, in the case of using a primer containing the thermal cross-linking agent (x1-2), for example, the primer is applied to a surface of a support and dried at a low temperature of room temperature (25° C.) to less than about 100° C. to thereby form a primer layer not having a cross-linked structure; subsequently the fluid (c-1) is applied; and then heating at a temperature of, for example, 150° C. or more, preferably 200° C. or more is performed to form a cross-linked structure. As a result, a conductive pattern having markedly high durability can be obtained: for example, separation of the conductive substance due to exposure to heat or external force for a long period of time does not occur.

Note that, in the case of using a support relatively susceptible to heat such as a support formed of polyethylene terephthalate, heating is preferably performed at a temperature of about 150° C. or less, preferably about 120° C. or less, from the standpoint of preventing the support from deforming, for example. Accordingly, the cross-linking agent is preferably not the thermal cross-linking agent (x1-2) but the thermal cross-linking agent (x1-1).

Examples of the metal chelate compounds that can be used as the thermal cross-linking agents (x1-1) include acetylacetone coordination compounds and acetoacetate coordination compounds of polyvalent metals such as aluminum, iron, copper, zinc, tin, titanium, nickel, antimony, magnesium, vanadium, chromium, and zirconium. It is preferable to use an acetylacetone coordination compound of aluminum, that is, acetylacetone aluminum.

Examples of the polyamine compounds that can be used as the thermal cross-linking agents (x1-1) include tertiary amines such as triethylenediamine and dimethylethanolamine.

Examples of the aziridine compounds that can be used as the thermal cross-linking agents (x1-1) include 2,2-bishydroxymethylbutanol-tris[3-(1-aziridinyl)propionate], 1,6-hexamethylenediethyleneurea, and diphenylmethane-bis-4,4'-N,N'-diethyleneurea.

Examples of the metallic salt compounds that can be used as the cross-linking agents (x1-1) include aluminum-containing compounds such as aluminum sulfate, aluminum alum, aluminum sulfite, aluminum thiosulfate, aluminum polychloride, aluminum nitrate nonahydrate, and aluminum chloride hexahydrate; and water-soluble metallic salts such as titanium tetrachloride, tetraisopropyl titanate, titanium acetylacetonate, and titanium lactate.

Examples of the isocyanate compounds that can be used as the thermal cross-linking agents (x1-1) include polyisocyanates such as tolylene diisocyanate, hydrogenated tolylene diisocyanate, triphenylmethane triisocyanate, methylenebis (4-phenylmethane)triisocyanate, isophorone diisocyanate, hexamethylene diisocyanate, and xylylene diisocyanate; isocyanurate-type polyisocyanate compounds obtained from the foregoing; adducts obtained from the foregoing and trimethylolpropane or the like; and polyisocyanato-group-containing urethanes obtained by a reaction between such a polyisocyanate compound and a polyol such as trimethylolpropane. In particular, it is preferable to use nurate of hexamethylene diisocyanate, adducts derived from hexamethylene diisocyanate and trimethylolpropane or the like, adducts derived from tolylene diisocyanate and trimethylolpropane or the like, and adducts derived from xylylene diisocyanate and trimethylolpropane or the like.

Examples of the melamine compounds that can be used as the thermal cross-linking agents (x1-2) include hexamethoxymethylmelamine, hexaethoxymethylmelamine, hexapropoxymethylmelamine, hexabutoxymethylmelamine, hexapentyloxymethylmelamine, hexahexyloxymethylmelamine, and etherified melamine mixtures that are each a combination of two among the foregoing. In particular, trimethoxymethylmelamine and hexamethoxymethylmelamine are preferably used. Examples of commercially available products include BECKAMINE M-3, APM, and J-101 (manufactured by DIC Corporation). Such a melamine compound undergoes a self-cross-linking reaction to form a cross-linked structure.

In the case of using such a melamine compound, in order to promote the self-cross-linking reaction, a catalyst such as an organic amine salt may be used. Examples of commercially available products include Catalyst ACX, 376, and the like. The amount of the catalyst relative to the whole amount of the melamine compound is preferably about 0.01% by mass to about 10% by mass.

Examples of the epoxy compounds that can be used as the thermal cross-linking agents (x1-2) include polyglycidyl ethers of aliphatic polyhydric alcohols such as ethylene glycol diglycidyl ether, propylene glycol diglycidyl ether, hexamethylene glycol diglycidyl ether, cyclohexanediol diglycidyl ether, glycerin diglycidyl ether, glycerin triglycidyl ether, trimethylolpropane triglycidyl ether, and pentaerythritol tetraglycidyl ether; polyglycidyl ethers of polyalkylene glycols such as polyethylene glycol diglycidyl ether, polypropylene glycol diglycidyl ether, and polytetramethylene glycol diglycidyl ether; polyglycidylamines such as 1,3-bis(N,N'-diglycidylaminoethyl)cyclohexane; polyglycidyl esters of polycarboxylic acids [oxalic acid, adipic acid, butanetricarboxylic acid, maleic acid, phthalic acid, terephthalic acid, isophthalic acid, benzenetricarboxylic acid, and the like]; bisphenol A-based epoxy resins such as a condensation product between bisphenol A and epichlorohydrin and an ethylene oxide adduct of a condensation product between bisphenol A and epichlorohydrin; phenol novolac resins; and various vinyl-based (co)polymers having epoxy groups in side chains. In particular, it is preferable to use polyglycidylamines such as 1,3-bis(N,N'-diglycidylaminoethyl)cyclohexane and polyglycidyl ethers of aliphatic polyhydric alcohols such as glycerin diglycidyl ether.

Examples of the epoxy compounds include, in addition to those described above, glycidyl-group-containing silane compounds such as γ-glycidoxypropyltrimethoxysilane, γ-glycidoxypropyltriethoxysilane, γ-glycidoxypropylmethyldimethoxysilane, γ-glycidoxypropylmethyldiethoxysilane, β-(3,4-epoxycyclohexyl)ethyltrimethoxysilane, β-(3,4-epoxycyclohexyl)ethyltriethoxysilane, β-(3,4-epoxycyclohexyl)ethylmethyldiethoxysilane, and γ-glycidoxypropyltriisopropenyloxysilane.

Examples of the oxazoline compounds that can be used as the thermal cross-linking agents (x1-2) include 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4'-dimethyl-2-oxazoline), 2,2'-p-phenylene-bis-(2-oxazoline), 2,2'-m-phenylene-bis-(2-oxazoline), 2,2'-m-phenylene-bis-(4,4'-dimethyl-2-oxazoline), bis-(2-oxazolinylcyclohexane)sulfide, and bis-(2-oxazolinylnorbornane)sulfide.

Other examples of the oxazoline compounds include oxazoline-group-containing polymers obtained by polymerizing addition-polymerizable oxazolines below and, if necessary, other monomers.

Examples of the addition-polymerizable oxazolines include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-methyl-2-oxazoline, and 2-isopropenyl-5-ethyl-2-oxazoline. These may be used alone or in combination of two or more thereof. In particular, 2-isopropenyl-2-oxazoline, which is industrially easily available, is preferably used.

Examples of the carbodiimide compounds that can be used as the thermal cross-linking agents (x1-2) include poly[phenylenebis(dimethylmethylene)carbodiimide] and poly(methyl-1,3-phenylenecarbodiimide). Examples of commercially available products include CARBODILITE V-01, V-02, V-03, V-04, V-05, and V-06 (manufactured by Nisshinbo Chemical Inc.) and UCARLINK XL-29SE and XL-29MP (manufactured by Union Carbide Corporation).

Examples of the blocked isocyanate compounds that can be used as the thermal cross-linking agents (x1-2) include isocyanate compounds described as examples of the thermal cross-linking agents (x1-1) whose isocyanato groups are partially or entirely blocked with blocking agents.

Examples of the blocking agents include phenol, cresol, 2-hydroxypyridine, butyl cellosolve, propylene glycol monomethyl ether, benzyl alcohol, methanol, ethanol, n-butanol, isobutanol, dimethyl malonate, diethyl malonate, methyl acetoacetate, ethyl acetoacetate, acetylacetone, butyl mercaptan, dodecyl mercaptan, acetanilide, acetamide, ε-caprolactam, δ-valerolactam, γ-butyrolactam, succinimide, maleimide, imidazole, 2-methylimidazole, urea, thiourea, ethylene urea, formamide oxime, acetaldoxime, acetone oxime, methyl ethyl ketoxime, methyl isobutyl ketoxime, cyclohexanone oxime, diphenylaniline, aniline, carbazole, ethyleneimine, and polyethyleneimine.

As the blocked isocyanate compounds, examples of aqueous-dispersion-type commercially available products include ELASTRON BN-69 (manufactured by DAI-ICHI KOGYO SEIYAKU CO., LTD.).

In the case of using such a cross-linking agent, the resin contained in the primer preferably has a group that can react with a cross-linkable functional group of the cross-linking agent. Specifically, in the cases where the (blocked) isocyanate compounds, melamine compounds, oxazoline compounds, or carbodiimide compounds are used as cross-linking agents, resins having hydroxy groups or carboxyl groups are preferably used as the above-described resins.

The amount of such a cross-linking agent used varies depending on the type, for example; however, in general, the amount relative to 100 parts by mass of the total mass of resin in the primer is preferably in the range of 0.01% by mass to 60% by mass, more preferably in the range of 0.1% by mass to 10% by mass, preferably in the range of 0.1% by mass to 5% by mass because a conductive pattern excellent in terms of adhesion and conductivity and excellent in terms of the durability can be formed.

The cross-linking agent is preferably added to a primer according to the present invention before the primer is applied to or impregnated into a surface of a support.

As the above-described additives, various fillers such as inorganic particles may be used. However, the amount of the fillers and the like used is preferably minimized in a primer according to the present invention, more preferably the amount relative to the whole amount of a primer according to the present invention is 5% by mass or less.

The amount of the additives used is not particularly limited as long as advantages of the present invention are not degraded; however, the amount relative to the whole amount of nonvolatile content of the primer is preferably in the range of 0.01% by mass to 40% by mass.

Examples of a method of applying the primer to a portion of or entirety of a surface of the support include a gravure process, a coating process, a screen process, a roller process, a rotary process, and a spray process.

After the primer is applied by the method, a commonly used method of removing the solvent contained in the coating layer is that, for example, a dryer is used to dry the layer and to evaporate the solvent. The drying temperature is set such that the solvent can be evaporated without adversely affecting the support.

The amount of the primer applied to the support is preferably adjusted such that the first primer layer (B-1) has a thickness in the above-described preferred range from the standpoint of achieving high adhesion and conductivity.

A method of forming the first conductive layer (C) or the first plating seed layer (C-1) for forming the first conductive layer (C) on the surface of the first primer layer (B-1) is, for example, a method of coating the surface of the first primer layer (B-1) with the fluid (c-1) and drying the fluid (c-1).

The fluid (c-1), which can be used for forming the conductive layer (C) or the first plating seed layer (C-1) for forming the conductive layer (C), is, for example, a fluid that contains the conductive substance and, if necessary, a solvent and additives and that can be generally used as a conductive ink or a plating nucleating agent.

Examples of the conductive substance include transition metals and compounds thereof. In particular, preferably used are ionic transition metals; preferably used are transition metals such as copper, silver, gold, nickel, palladium, platinum, and cobalt; more preferably used are copper, silver, gold, and the like because conductive patterns having low electrical resistance and high resistance to corrosion can be formed; and still more preferably used is silver.

In a case where the fluid (c-1) is used as a plating nucleating agent, the conductive substance may be one or more types of metal particles formed of the transition metals and metal particles the surfaces of which are coated with oxides of the transition metals or organic substances.

The oxides of transition metals are normally inactive (insulating); however, the oxides can be treated with a reducing agent such as dimethylaminoborane to provide exposed metals, which are active (conductive).

The metals the surfaces of which are coated with organic substances are, for example, resin particles (organic substances) formed by an emulsion polymerization method or the like so as to contain metals therein. The particles are normally inactive (insulating); however, the organic substances can be removed with a laser or the like to provide exposed metals, which are active (conductive).

The conductive substance is preferably particles having an average particle size of about 1 nm to about 100 nm; more preferably particles having an average particle size of 1 nm to 50 nm because conductive patterns that are fine and have low resistance values after firing can be formed, compared with the cases of using conductive substances having an average particle size on the order of micrometers. Note that the "average particle size" is a volume-average value determined by measuring the conductive substance by a dynamic light scattering method, the conductive substance being diluted with a good dispersion solvent. This measurement can be carried out with a Nanotrac UPA-150 manufactured by Microtrac, Inc.

The fluid (c-1) preferably contains the conductive substance, relative to the whole amount of the fluid (c-1), in the range of 5% by mass to 90% by mass, more preferably in the range of 10% by mass to 60% by mass.

The fluid (c-1) preferably contains a solvent from the standpoint of enhancing coatability or the like. Examples of the solvent include organic solvents and aqueous media.

Examples of the solvent include aqueous media such as distilled water, deionized water, pure water, and ultrapure water; and organic solvents such as alcohols, ethers, esters, and ketones.

Examples of the alcohols include methanol, ethanol, n-propanol, isopropyl alcohol, n-butanol, isobutyl alcohol, sec-butanol, tert-butanol, heptanol, hexanol, octanol, nonanol, decanol, undecanol, dodecanol, tridecanol, tetradecanol, pentadecanol, stearyl alcohol, allyl alcohol, cyclohexanol, terpineol, terpineol, dihydroterpineol, ethylene glycol monomethyl ether, ethylene glycol monoethyl ether, ethylene glycol monobutyl ether, diethylene glycol monoethyl ether, diethylene glycol monomethyl ether, diethylene glycol monobutyl ether, tetraethylene glycol monobutyl ether, propylene glycol monomethyl ether, dipropylene glycol monomethyl ether, tripropylene glycol monomethyl ether, propylene glycol monopropyl ether, dipropylene glycol monopropyl ether, propylene glycol monobutyl ether, dipropylene glycol monobutyl ether, and tripropylene glycol monobutyl ether.

The fluid (c-1) may contain, in addition to the conductive substance and the solvent, for example, ethylene glycol, diethylene glycol, 1,3-butanediol, isoprene glycol, or the like.

The fluid (c-1) is preferably a liquid or a viscous liquid having a viscosity measured with a B-type viscometer at about 25° C., in the range of 0.1 mPa·s to 500,000 mPa·s, preferably in the range of 0.5 mPa·s to 10,000 mPa·s. In a case where the fluid (c-1) is applied (by printing) by a method such as the inkjet printing method, the fluid (c-1) preferably has a viscosity in the range of 5 mPa·s to 20 mPa·s.

Examples of the method of applying the fluid (c-1) include an inkjet printing method, an electric-field inkjet method, a reverse printing method, a screen printing method, an offset printing method, a spin-coating method, a spray coating method, a bar coating method, a die coating method, a slit coating method, a roll coating method, a dip coating method, and a dispenser method.

In particular, in a case where the fluid (c-1) is used to form the conductive layer (C) or the first plating seed layer (C-1) for forming the conductive layer (C) having a fine line pattern in the range of about 0.01 μm to about 100 μm, which is in demand to achieve higher densities of electronic circuits and the like, the fluid (c-1) is preferably applied by the inkjet printing method or the reverse printing method.

The inkjet printing method can be carried out with what is generally referred to as an inkjet printer. Specific examples include Konica Minolta EB100 and XY100 (manufactured by Konicaminolta IJ Technologies, Inc.) and Dimatix material printer DMP-3000 and Dimatix material printer DMP-2831 (manufactured by FUJIFILM Corporation).

A drying method carried out after the fluid (c-1) is applied by the above-described method may be a method of firing the applied fluid for the purpose of bonding together conductive substances such as metals contained within the fluid (c-1) to form the conductive layer (C) or the first plating seed layer (C-1) for forming the conductive layer (C). This firing is preferably carried out in the range of about 80° C. to about 300° C. for about 2 minutes to about 200 minutes. The firing may be carried out in the air; however, from the standpoint of preventing oxidation of the metals, the firing step may be partially or entirely carried out in a reducing atmosphere.

The firing step can be carried out with, for example, an oven, a hot-gas drying oven, an infrared drying oven, or a heating roll, or by laser radiation, photo-sintering (firing by light), or optical pulse radiation, or with microwaves.

The first plating seed layer (C-1), which can be formed by applying and firing the fluid (c-1), may have a surface a portion of or entirety of which is oxidized. Specifically, the surface of the first plating seed layer (C-1) may be subjected to a plasma discharge treatment such as a corona treatment.

The plasma discharge treatment is not particularly limited and is carried out by, for example, an atmospheric-pressure plasma discharge treatment method such as a corona discharge treatment method or a vacuum plasma discharge treatment method carried out in a vacuum or at a reduced pressure such as a glow discharge treatment method or an arc discharge treatment method.

The atmospheric-pressure plasma discharge treatment method is a method of carrying out plasma discharge treatment in an atmosphere having an oxygen concentration in the range of about 0.1% by mass to about 25% by mass. In the present invention, in particular, preferably employed is the plasma discharge treatment carried out in the range of 10% by mass to 22% by mass, more preferably employed is a corona discharge treatment method carried out in the air (oxygen concentration of about 21% by mass), in order to achieve high adhesion.

The atmospheric-pressure plasma discharge treatment method is preferably carried out in an environment containing the oxygen and an inert gas because higher adhesion can be achieved without forming excessive irregularities in the surface of the first plating seed layer (C-1). Examples of the inert gas include argon and nitrogen.

The atmospheric-pressure plasma discharge treatment method can be carried out with, for example, an atmospheric-pressure plasma treatment apparatus (AP-T01) manufactured by SEKISUI CHEMICAL CO., LTD.

The atmospheric-pressure plasma discharge treatment method is preferably carried out at a flow rate of a gas such as air in the range of about 5 liters/min to about 50 liters/min. The power is preferably in the range of about 50 W to about 500 W. The time for treatment using plasma is preferably in the range of about 1 second to about 500 seconds.

As the atmospheric-pressure plasma discharge treatment method, specifically, the corona discharge treatment method is preferably employed. In the case of employing the corona discharge treatment method, for example, corona surface modification test equipment (TEC-4AX) manufactured by KASUGA DENKI, INC. can be used.

The corona discharge treatment method is preferably carried out with a power in the range of about 5 W to about 300 W. The time for corona discharge treatment is preferably in the range of about 0.5 seconds to about 600 seconds.

The step [2] carried out during production of the laminate is a step of plating a portion of or entirety of the surface of the first plating seed layer (C-1) to form a first plating layer (C-2), to thereby form the conductive layer (C) including the first plating seed layer (C-1) and the first plating layer (C-2).

Examples of the plating method include dry plating methods such as a sputtering method and a vacuum deposition method; wet plating methods such as an electroless plating method and an electroplating method; and methods that are combinations of two or more of these plating methods.

The first plating layer (C-2) formed by the above-described plating method has high adhesion to the surface of the first plating seed layer (C-1). In particular, the first plating layer (C-2) formed by an electroplating method can exhibit very high adhesion to the surface of the first plating seed layer (C-1).

The dry plating step can be carried out by, for example, a sputtering method or a vacuum deposition method. The sputtering method is as follows: an inert gas (mainly argon) is introduced into a vacuum; negative ions are applied to a first plating layer (C-2)-forming material to cause glow discharge; subsequently, the inert gas atoms are ionized; the gas ions are made to strongly strike the surface of the plating layer (C-2)-forming material at a high speed to sputter atoms or molecules from the plating layer (C-2)-forming material and to vigorously deposit the atoms or molecules onto the surface of the first plating seed layer (C-1), to thereby form the plating layer (C-2).

Examples of the plating layer (C-2)-forming material include chromium (Cr), copper (Cu), titanium (Ti), silver (Ag), platinum (Pt), gold (Au), nickel-chromium (Ni—Cr), SUS, copper-zinc (Cu—Zn), ITO, $SiO_2$, $SiO_2$, $Nb_2O_5$, and ZnO.

The plating treatment by the sputtering method can be carried out with, for example, a magnetron sputtering apparatus or the like.

The vacuum deposition method is a method of heating, in a vacuum, the plating layer (C-2)-forming material such as various metals and metal oxides to melt and evaporate or sublime the material, so that the metal atoms or molecules are made to adhere to the surface of the first plating seed layer (C-1) to thereby form the plating layer (C-2).

Examples of the plating layer (C-2)-forming material that can be used in the vacuum deposition method include aluminum (Al), silver (Ag), gold (Au), titanium (Ti), nickel (Ni), copper (Cu), chromium (Cr), tin (Sn), indium (In), $SiO_2$, $ZrO_2$, $Al_2O_3$, and $TiO_2$.

The electroless plating method that can be used as the plating method is, for example, a method of bringing an electroless plating solution into contact with a conductive substance of the first plating seed layer (C-1), such as palladium or silver, to deposit a metal such as copper contained in the electroless plating solution to thereby form an electroless plating layer (film) that is a metal film.

The electroless plating solution may be, for example, a solution containing a conductive substance formed of a metal such as copper, nickel, chromium, cobalt, or tin, a reducing agent, and a solvent such as an aqueous medium or an organic solvent.

Examples of the reducing agent include dimethylaminoborane, hypophosphorous acid, sodium hypophosphite, dimethylaminoborane, hydrazine, formaldehyde, sodium borohydride, and phenols.

If necessary, the electroless plating solution may contain a complexing agent such as an organic acid such as a monocarboxylic acid such as acetic acid or formic acid; a dicarboxylic acid such as malonic acid, succinic acid, adipic acid, maleic acid, or fumaric acid; a hydroxycarboxylic acid such as malic acid, lactic acid, glycolic acid, gluconic acid, or citric acid; an amino acid such as glycine, alanine, iminodiacetic acid, arginine, aspartic acid, or glutamic acid; or an aminopolycarboxylic acid such as iminodiacetic acid, nitrilotriacetic acid, ethylenediaminediacetic acid, ethylenediaminetetraacetic acid, or diethylenetriaminepentaacetic acid, a soluble salt of such an organic acid (sodium salt, potassium salt, ammonium salt, or the like), or an amine such as ethylenediamine, diethylenetriamine, or triethylenetetramine.

The electroless plating solution being used preferably has a temperature in the range of about 20° C. to about 98° C.

The electroplating method that can be used as the plating method is, for example, a method of passing a current while an electroplating solution is in contact with the conductive substance of the first plating seed layer (C-1) or the surface of an electroless plating layer (film) formed by the electroless treatment, so that a metal such as copper contained within the electroplating solution is deposited on the cathode, that is, the conductive substance of the first plating seed layer (C-1) or the surface of the electroless plating layer (film) formed by the electroless treatment, to thereby form an electroplating film (metal film).

The electroplating solution is, for example, a solution containing a metal such as copper, nickel, chromium, cobalt, or tin, a sulfide of the foregoing or the like, sulfuric acid or the like, and an aqueous medium. A specific example of the electroplating solution contains copper sulfate, sulfuric acid, and an aqueous medium.

The electroplating solution being used preferably has a temperature in the range of about 20° C. to about 98° C.

The electroplating method is preferably used to form a layer formed of copper because this method is easily carried out without use of highly poisonous substances.

The step [3] carried out during production of the laminate is a step of forming an insulating layer (D) on a portion of or entirety of a surface of the first plating layer (C-2) formed in the step [2].

A method of forming the insulating layer (D) may be a method of bonding a preformed insulating film or insulating sheet to a portion of or entirety of a surface of the first plating layer (C-2), with an adhesive or the like.

Another method of forming the insulating layer (D) may be a method of applying a resin composition (d) for forming the insulating layer (D) and drying the resin composition (d), for example.

Examples of the preformed insulating film or insulating sheet include films and sheets such as TFA-5602525 (manufactured by KYOCERA Chemical Corporation, polyimide film, thickness of insulating layer: 12 μm, thickness of adhesive layer: 20 μm), NICAFLEX CISA2535 (manufactured by NIKKAN INDUSTRIES CO., LTD., polyimide film, thickness of insulating layer: 25 μm, thickness of adhesive: 35 μm), ABF-GX3 (manufactured by Ajinomoto Fine-Techno Co., Inc., epoxy-based film), CT-F (manufactured by KURARAY CO., LTD., liquid crystal polymer film, thickness of insulating layer: 25 μm), and BIAC-FILM (manufactured by Primatec Inc., liquid crystal polymer film, thickness of insulating layer: 25 μm).

The resin composition (d) for forming the insulating layer (D) may be a resin composition containing a polyimide varnish, for example.

Examples of a method of applying the resin composition (d) to at least a portion of or entirety of a surface of the first conductive layer (C) include a gravure process, a coating process, a screen process, a roller process, a rotary process, and a spray process.

After the resin composition (d) is applied by the method, a commonly used method of removing the solvent contained in the coating layer is that, for example, a dryer is used to dry the layer and to evaporate the solvent. The drying temperature is set such that the solvent can be evaporated without adversely affecting the support.

In a case where the step [2] provides a structure in which the first conductive layer (C) is formed on a portion of the surface of the first primer layer (B-1), the resin composition (d) may be applied not only to the surface of the first conductive layer (C) but also to the surface of the primer layer (B-1), to thereby form the insulating layer (D).

The coating amount of the resin composition (d) is preferably adjusted such that the insulating layer (D) has a thickness in the above-described preferred range in order to achieve insulation between the first conductive layer (C) and the second conductive layer (E) and to achieve reduction in the thickness of the laminate.

The step [4] carried out during production of the laminate is a step of coating a portion of or entirety of the insulating layer (D) formed in the step [2], with a primer for forming a second primer layer (B-2) to provide a coated surface, coating a portion of or entirety of the coated surface with a fluid (e-1) containing a conductive substance to provide a laminate including the insulating layer (D), the second primer layer (B-2), and a second plating seed layer (E-1).

The primer that can be used for forming the second primer layer (B-2) on a portion of or entirety of the insulating layer (D) may be the same as the above-described examples of the primer that can be used for forming the first primer layer (B-1). The first primer layer (B-1) and the second primer layer (B-2) may have the same composition or different compositions.

The method of applying the primer used for forming the second primer layer (B-2), the thickness of the primer layer (B-2), and the like are also preferably set to the same method and range described as examples of the method of applying the primer used for forming the first primer layer (B-1) and the thickness.

A method of forming the second plating seed layer (E-1) for forming the second conductive layer (E) on the second primer layer (B-2) formed by the method is, for example, a method of coating a portion of or entirety of the primer layer (B-2) with the fluid (e-1) containing a conductive substance and drying the fluid (e-1).

The fluid (e-1) may be the same as the fluid (c-1), which is described as an example that can be used for forming the first conductive layer (C). Also, a method of applying and drying the fluid (e-1) may be the same as the method of applying and drying the fluid (c-1).

In the present invention, the fluid (c-1) and the fluid (e-1) may have the same composition or may have different compositions. By using the fluid (c-1) and the fluid (e-1) that have the same composition, a coating apparatus adjusted for the fluids can be used and the production efficiency of a laminate according to the present invention can be increased. For this reason, the fluids having the same composition are preferably used.

The step [5] carried out during production of the laminate is a step of plating a portion of or entirety of a surface of the second plating seed layer (E-1) to form a second conductive layer (E) including the second plating layer (E-2) on the surface of the second plating seed layer (E-1).

A plating method for forming the second plating layer (E-2) may be the same as the plating method described as an example of the plating method for forming the first plating layer (C-2).

The laminate obtained by the above-described method can be used as a conductive pattern. Specifically, the laminate can be used for formation of electronic circuits using silver ink or the like, formation of layers or peripheral wiring in, for example, organic solar cells, electronic book terminals, organic EL, organic transistors, flexible printed boards, and RFIDs; and can be used as a conductive pattern for manufacturing of, for example, wiring of electro-magnetic shields in plasma displays; more specifically, the laminate can be preferably used for formation of circuit boards. In such a case, the first conductive layer (C) and the second conductive layer (E) in the laminate may be connected to each other via another wiring or the like, or may individually form independent circuits. Alternatively, the first conductive layer (C) and the second conductive layer (E) may be connected to each other by, for example, subjecting a portion of the laminate to processing such as cutting and applying the fluid.

In a case where the laminate is used as a conductive pattern, for example, a fluid that can form the first conductive layer (C) and the second conductive layer (E) is applied and fired at positions corresponding to a desired pattern configuration to be formed, so that a conductive pattern having the desired pattern can be produced.

The laminate such as a conductive pattern obtained by the above-described method is thin and can maintain good continuity without causing separation between layers or the like. Accordingly, the laminate can be preferably used in applications particularly requiring durability among formation of electronic circuits in, for example, organic solar cells, electronic book terminals, organic EL, organic transistors, flexible printed boards, and RFIDs of noncontact IC cards and the like, wiring of electro-magnetic shields in plasma displays, and the like. In particular, a conductive pattern having been subjected to the plating treatment allows formation of a wiring pattern with high reliability in which good continuity can be maintained without causing disconnection or the like for a long period of time. Accordingly, for example, such a conductive pattern is generally referred to as a Copper Clad Laminate (CCL) and can be used in applications including flexible printed circuit boards (FPC), tape automated bonding (TAB), chip on film (COF), and printed wiring boards (PWB).

EXAMPLES

Hereinafter, the present invention will be described in detail with reference to examples.

Synthesis Example 1

Preparation of Aqueous Dispersion of Urethane Resin (Y-1)

In a vessel equipped with a thermometer, a nitrogen gas inlet tube, and a stirrer and purged with nitrogen, 100 parts by mass of a polyester polyol (polyester polyol obtained by a reaction between 1,4-cyclohexanedimethanol, neopentyl glycol, and adipic acid; hydroxy equivalent weight of 1000 g/eq), 17.4 parts by mass of 2,2-dimethylolpropionic acid, 21.7 parts by mass of 1,4-cyclohexanedimethanol, and 106.2 parts by mass of dicyclohexylmethane diisocyanate were mixed and caused to react within 178 parts by mass of methyl ethyl ketone. As a result, an organic solvent solution of a urethane prepolymer having an end isocyanato group was obtained.

Subsequently, to the organic solvent solution of the urethane prepolymer, 13.3 parts by mass of triethylamine was added to thereby neutralize partially or entirely the carboxyl groups of the urethane resin. Furthermore, 277 parts by mass of water was added and the solution was sufficiently stirred to provide an aqueous dispersion of a urethane resin having carboxylate groups formed by neutralization.

Subsequently, to the aqueous dispersion, 8 parts by mass of a 25% by mass ethylenediamine aqueous solution was added and the dispersion was stirred; subsequently, the polyurethane resin in a particle form was subjected to chain extension; and aging and removal of the solvent were then carried out. Thus, an aqueous dispersion of urethane resin (Y-1) having a solid content of 30% by mass was obtained. This obtained urethane resin had an acid value of 30 and a weight-average molecular weight of 55,000.

Synthesis Example 2

Preparation of Aqueous Dispersion of Vinyl Polymer (Y-2)

To a reaction vessel equipped with a stirrer, a reflux condenser, a nitrogen inlet tube, a thermometer, and dropping funnels, 115 parts by mass of deionized water and 4 parts by mass of LATEMUL E-118B (manufactured by Kao Corporation, active component: 25% by mass) were placed; while nitrogen was introduced, the temperature was increased to 75° C.

To the reaction vessel under stirring, a portion (5 parts by mass) of a monomer pre-emulsion was added, the monomer pre-emulsion being prepared by mixing a vinyl monomer mixture containing 46 parts by mass of methyl methacrylate, 45 parts by mass of n-butyl acrylate, 2 parts by mass of methacrylic acid, 5 parts by mass of 2-hydroxyethyl methacrylate, and 2 parts by mass of N-methylolacrylamide, 4 parts by mass of AQUALON KH-1025 (manufactured by DAI-ICHI KOGYO SEIYAKU CO., LTD., active component: 25% by mass), and 15 parts by mass of deionized water. Subsequently, 0.1 parts by mass of persulfate potassium was added. While the internal temperature of the reaction vessel was maintained at 75° C., polymerization was caused for 60 minutes.

Subsequently, while the internal temperature of the reaction vessel was maintained at 75° C., the remainder of the monomer pre-emulsion (114 parts by mass) and 30 parts by mass of an aqueous solution of persulfate potassium (active component: 1.0% by mass) were separately dropped with the individual dropping funnels over 180 minutes. After the dropping was completed, the solution was stirred at the same temperature for 60 minutes.

The internal temperature of the reaction vessel was decreased to 40° C., and aqueous ammonia (active component: 10% by mass) was used such that the aqueous dispersion in the reaction vessel had a pH of 8.5.

Subsequently, deionized water was used to adjust the nonvolatile content to be 20% by mass. After that, an aqueous solution of trimethoxymethylolmelamine (manufactured by DIC Corporation, BECKAMINE M-3) was added as a crosslinking agent in an amount of 3% by mass relative to the nonvolatile content of the aqueous dispersion. The dispersion was filtered through a 200 mesh filter cloth to provide an aqueous dispersion of vinyl polymer (Y-2) having a carboxyl group and an N-methylolacrylamide group.

Synthesis Example 3

Preparation of Aqueous Dispersion of Urethane-Acrylic Composite Resin (Y-3)

To a reaction vessel equipped with a stirrer, a reflux condenser, a nitrogen inlet tube, a thermometer, a dropping funnel for dropping a monomer mixture, and a dropping funnel for dropping a polymerization catalyst, 280 parts by mass of deionized water and 333 parts by mass of the aqueous dispersion of the urethane resin (Y-1) obtained in Synthesis example 1 were placed. While nitrogen was introduced, the temperature was increased to 80° C.

To the reaction vessel having been heated to 80° C., under stirring, in order to obtain a vinyl polymer for forming a core layer, a monomer mixture containing 48 parts by mass of methyl methacrylate, 44 parts by mass of n-butyl acrylate, and 8 parts by mass of 2-hydroxyethyl methacrylate, and 20 parts by mass of an ammonium persulfate aqueous solution (concentration: 0.5% by mass) were individually dropped with the dropping funnels over 120 minutes to cause polymerization while the internal temperature of the reaction vessel was maintained in the range of 80° C.±2° C.

After the dropping was completed, the solution was stirred at the same temperature for 60 minutes. The internal temperature of the reaction vessel was then decreased to 40° C. Subsequently, deionized water was used to adjust the non-volatile content to be 20% by mass. The solution was then filtered through a 200 mesh filter cloth to provide an aqueous dispersion of urethane-acrylic composite resin (Y-3) having a shell layer formed of the urethane resin and a core layer formed of a vinyl polymer having a carboxyl group.

Synthesis Example 4

Preparation of Aqueous Dispersion of Urethane-Acrylic Composite Resin (Y-4)

To a reaction vessel equipped with a stirrer, a reflux condenser, a nitrogen inlet tube, a thermometer, a dropping funnel for dropping a monomer mixture, and a dropping funnel for dropping a polymerization catalyst, 280 parts by mass of deionized water and 333 parts by mass of the aqueous dispersion of the urethane resin (Y-1) obtained in Synthesis example 1 were placed. While nitrogen was introduced, the temperature was increased to 80° C.

To the reaction vessel having been heated to 80° C., under stirring, in order to obtain a vinyl polymer for forming a core layer, a monomer mixture containing 46 parts by mass of methyl methacrylate, 38 parts by mass of n-butyl acrylate, 8 parts by mass of 2-hydroxyethyl methacrylate, and 8 parts by mass of N-n-butoxymethylacrylamide and 20 parts by mass of an ammonium persulfate aqueous solution (concentration: 0.5% by mass) were individually dropped with the dropping funnels over 120 minutes to cause polymerization while the internal temperature of the reaction vessel was maintained in the range of 80° C.±2° C.

After the dropping was completed, the solution was stirred at the same temperature for 60 minutes. The internal temperature of the reaction vessel was then decreased to 40° C. Subsequently, deionized water was used to adjust the non-volatile content to be 20% by mass. The solution was then filtered through a 200 mesh filter cloth to provide an aqueous dispersion of urethane-acrylic composite resin (Y-4) having a shell layer formed of the urethane resin and a core layer formed of a vinyl polymer having an N-n-butoxymethyl group.

Synthesis Example 5

Preparation of Polyimide Varnish (Y-5)

In 3400 g of N-methylpyrrolidone, 410 g (1 mole) of 2,2-bis[4-(4-aminophenoxy)phenyl]propane and 192 g (0.98 moles) of 1,2,3,4-cyclobutanetetracarboxylic dianhydride were caused to react at room temperature for 8 hours to thereby provide polyimide varnish (Y-5).

Example 1

The aqueous dispersion of the urethane resin (Y-1) obtained in Synthesis example 1 was used as a primer. The primer was applied to, with a spin coater, a surface of a support that was a polyimide film (Kapton 150EN-C, manufactured by DU PONT-TORAY CO., LTD., thickness: 37.5 µm) having been subjected to corona treatment, so as to form a primer layer having a thickness of 1 µm. The primer layer was dried with a hot-gas dryer at 80° C. for 3 minutes to thereby provide a laminate having, on the support, the primer layer not having a cross-linked structure.

On the surface of the primer layer to be cross-linked, a fluid 1 described later on was used to print, with an inkjet printer (inkjet test apparatus EB100, manufactured by Konicaminolta IJ Technologies, Inc.; test printer head KM512L; discharge amount: 42 pl), a line having a line width of 100 µm and a film thickness of 0.5 µm so as to have a U-shape rotated 90° clockwise as indicated by reference sign 2 in FIG. 1. The ends of the line were provided with tabs having 2 mm sides to which BSP probes were connectable. Subsequently, firing was carried out at 150° C. for 30 minutes. As a result, the primer layer having a cross-linked structure and a first plating seed layer for forming a first conductive layer were formed on the surface of the layer including the support.

Subsequently, electroplating was carried out at an electric current density of 2 A/dm$^2$ for 15 minutes, with an electroplating solution containing copper sulfate, such that the surface of the first plating seed layer was set as a cathode and phosphorus-containing copper was set as an anode. As a result, the first conductive layer was formed in which a first copper plating layer having a thickness of 8 µm was formed on the surface of the first plating seed layer. Thus, a laminate (I) was obtained. The electroplating solution contained 70 g/liter of copper sulfate, 200 g/liter of sulfuric acid, 50 mg/liter of chlorine ions, and 5 g/liter of Top Lucina SF (brightener manufactured by Okuno Chemical Industries Co., Ltd.).

Subsequently, NICAFLEX CISA2535 (manufactured by NIKKAN INDUSTRIES CO., LTD., thickness of insulating layer: 25 µm, thickness of adhesive: 35 µm) for forming the insulating layer was placed on the surface of the laminate (I), the surface including the first plating layer, and pressed in the range of 2 MPa to 4 MPa and in the press-temperature range of not more than 160° C. to thereby form an insulating layer on the surface of the laminate (I).

Subsequently, as a resin composition for forming a second primer layer, the aqueous dispersion of the urethane-acrylic composite resin (Y-4) obtained in Synthesis example 4 was used. This aqueous dispersion was applied to, with a spin coater, the surface of the insulating layer of the laminate and dried with a hot-gas dryer at 80° C. for 3 minutes. This provided a laminate (II) in which a second primer layer was formed on the surface of the insulating layer.

Figure 2:
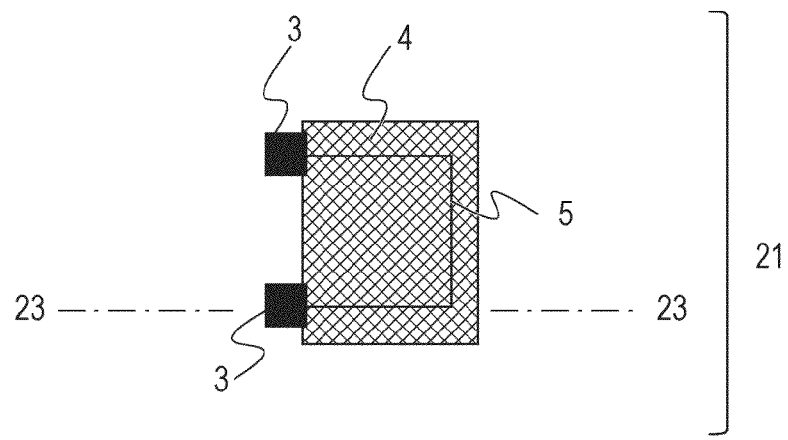
FIG. 2 is a top view of a conductive pattern in which a second conductive layer (E) is formed on the surface of a second primer layer (B-2).

Subsequently, on the surface of the second primer layer of the laminate (II), a fluid 1 described later on was used to print, with an inkjet printer (inkjet test apparatus EB100, manufactured by Konicaminolta IJ Technologies, Inc.; test printer head KM512L; discharge amount: 42 pl), a line having a line width of 100 µm and a film thickness of 0.5 µm, so as to have a U-shape rotated 90° anticlockwise as indicated by reference sign 5 in FIG. 2. The ends of the line were provided with tabs having 2 mm sides to which BSP probes were connectable. Subsequently, firing was carried out at 150° C. for 30 minutes. This provided a laminate (III) in which the layer including the support, the first primer layer, the first conductive layer, the insulating layer, the second primer layer, and the second plating seed layer were stacked.

Subsequently, electroplating was carried out at an electric current density of 2 A/dm$^2$ for 15 minutes, with an electroplating solution containing copper sulfate, such that the surface of the second plating seed layer of the laminate (III) was set as a cathode and phosphorus-containing copper was set as an anode. As a result, a second conductive layer was formed in which a second copper plating layer having a thickness of 8 μm was formed on the surface of the second plating seed layer. The electroplating solution contained 70 g/liter of copper sulfate, 200 g/liter of sulfuric acid, 50 mg/liter of chlorine ions, and 5 g/liter of Top Lucina SF (brightener manufactured by Okuno Chemical Industries Co., Ltd.).

Figure 3:
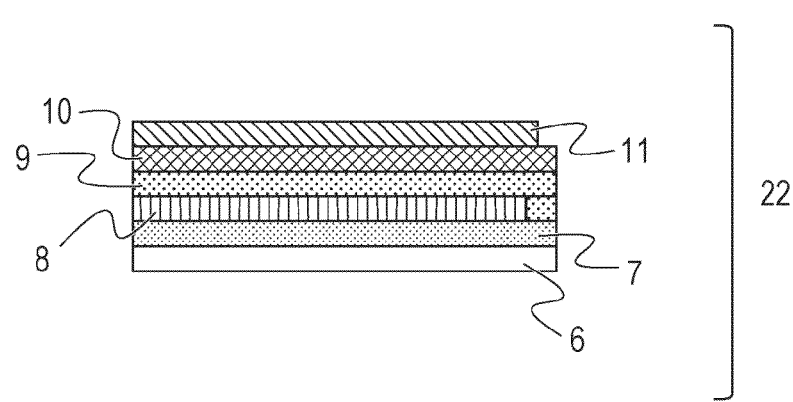
FIG. 3 is a sectional view of a laminate.

The above-described method provided a laminate (IV) in which the layer including the support, the first primer layer, the first conductive layer, the insulating layer, the second primer layer, and the second conductive layer were stacked. FIG. 3 is a sectional view of the laminate (IV) taken along alternating long and short dashed line 23.

Example 2

A laminate in which a layer including a support, a first primer layer, a first conductive layer, an insulating layer, a second primer layer, and a second conductive layer were stacked was obtained as in Example 1 except that, as the primer, the aqueous dispersion of the urethane resin (Y-1) obtained in Synthesis example 1 was replaced by the aqueous dispersion of the urethane-acrylic composite resin (Y-3) obtained in Synthesis example 3.

[Preparation of Fluid 1]

In a nitrogen atmosphere, a chloroform (30 ml) solution containing 9.6 g of p-toluenesulfonic chloride was dropped for 30 minutes in a mixture being cooled with ice and stirred, the mixture containing 20 g of methoxypolyethylene glycol (number-average molecular weight: 2,000), 8.0 g of pyridine, and 20 ml of chloroform. The solution was then stirred at a bath temperature of 40° C. for 4 hours and mixed with 50 ml of chloroform.

Subsequently, the product was washed with 100 ml of a 5% by mass aqueous solution of hydrochloric acid, then washed with 100 ml of a saturated sodium hydrogencarbonate aqueous solution, then washed with 100 ml of a saturated brine aqueous solution, subsequently dried with anhydrous magnesium sulfate, filtered, concentrated under a reduced pressure, washed with hexane several times, then filtered, and dried at 80° C. under a reduced pressure to thereby provide methoxypolyethylene glycol having a p-toluenesulfonyloxy group.

The methoxypolyethylene glycol (5.39 g) having a p-toluenesulfonyloxy group, 20 g of polyethyleneimine (manufactured by Aldrich Corporation, molecular weight: 25,000), 0.07 g of potassium carbonate, and 100 ml of N,N-dimethylacetamide were mixed together and stirred in a nitrogen atmosphere at 100° C. for 6 hours.

Subsequently, 300 ml of a mixed solution of ethyl acetate and hexane (volume ratio of ethyl acetate/hexane=1/2) was added. The solution was vigorously stirred at room temperature and the product was then collected as a solid by filtration. This solid was washed with 100 ml of a mixed solution of ethyl acetate and hexane (volume ratio of ethyl acetate/hexane=1/2) and subsequently dried under a reduced pressure to thereby provide a compound of polyethyleneimine bonded with polyethylene glycol.

An aqueous solution (138.8 g) containing 0.592 g of the compound of polyethyleneimine bonded with polyethylene glycol was mixed with 10 g of silver oxide and stirred at 25° C. for 30 minutes.

Subsequently, 46 g of dimethylethanolamine was gradually added under stirring and the solution was stirred at 25° C. for 30 minutes.

Subsequently, 15.2 g of a 10% by mass aqueous solution of ascorbic acid was gradually added under stirring and the solution was stirred for 20 hours to thereby provide a dispersion of silver.

To the dispersion of silver, a mixed solvent of 200 ml of isopropyl alcohol and 200 ml of hexane was added. The solution was stirred for 2 minutes and then concentrated by centrifugation at 3000 rpm for 5 minutes. After the supernatant fluid was removed, a mixed solvent of 50 ml of isopropyl alcohol and 50 ml of hexane was added to the precipitate. The solution was stirred for 2 minutes and then concentrated by centrifugation at 3000 rpm for 5 minutes. After the supernatant fluid was removed, 20 g of water was further added to the precipitate. The solution was stirred for 2 minutes and the organic solvent was removed under a reduced pressure. Furthermore, 10 g of water was added and the substance was dispersed by stirring. The dispersion was then left in a freezer at −40° C. for a whole day and night to freeze. The frozen dispersion was treated with a freeze dryer (FDU-2200, manufactured by TOKYO RIKAKIKAI CO., LTD.) for 24 hours to thereby provide a silver-containing powder that was a mass of gray-green flakes having a metallic luster.

The silver-containing powder (25.9 g) obtained above was mixed with 45 g of ethylene glycol and 55 g of deionized water and stirred for 3 hours to thereby prepare a fluid 1 (silver content: 20% by mass, mass content of polyethyleneimine: 1% by mass, viscosity: 10 mPa·s), which can be used as a conductive ink for inkjet printing.

Example 3

A laminate in which a layer including a support, a first primer layer, a first conductive layer, an insulating layer, a second primer layer, and a second conductive layer were stacked was obtained as in Example 1 except that the NICAFLEX CISA2535 (manufactured by NIKKAN INDUSTRIES CO., LTD., thickness of insulating layer: 25 μm, thickness of adhesive: 35 μm) for forming an insulating layer was replaced by "TFA-5602525", which is a film manufactured by KYOCERA Chemical Corporation (thickness of insulating layer: 12 μm, thickness of adhesive layer: 20 μm).

Example 4

A laminate in which a layer including a support, a first primer layer, a first conductive layer, an insulating layer, a second primer layer, and a second conductive layer were stacked was obtained as in Example 1 except that, as the resin composition for forming the insulating layer, the polyimide varnish (Y-5) obtained in Synthesis example 5 was used instead of the NICAFLEX CISA2535 (manufactured by NIKKAN INDUSTRIES CO., LTD., thickness of insulating layer: 25 μm, thickness of adhesive: 35 μm).

Example 5

A laminate in which a layer including a support, a first primer layer, a first conductive layer, an insulating layer, a second primer layer, and a second conductive layer were stacked was obtained as in Example 3 except that, as the primer for forming the first primer layer, the aqueous dispersion of the urethane-acrylic composite resin (Y-3) was replaced by the aqueous dispersion of the vinyl polymer (Y-2) obtained in Synthesis example 2.

Comparative Example 1

An attempt to produce a laminate as in Example 1 was made except that the first primer layer was not formed.

However, the first conductive layer became separated from the support during the plating step, resulting in degradation of continuity or disconnection. Thus, the insulating layer, the second primer layer, and the second conductive layer were not formed.

Comparative Example 2

An attempt to produce a laminate as in Example 1 was made except that the second primer layer was not formed.

However, the second conductive layer became separated from the insulating layer, resulting in degradation of continuity or disconnection of the second conductive layer.

[Method for Evaluating Adhesion]

A cellophane adhesive tape (manufactured by Nichiban Co., Ltd., CT405AP-24, 24 mm) was press-bonded, with a finger, to the surface of the second conductive layer of the laminate. Subsequently, the cellophane adhesive tape was separated at an angle of 90° with respect to the surface of the laminate. The adhesive surface of the separated cellophane adhesive tape was visually inspected and, on the basis of the presence or absence of adhering matter, the adhesion was evaluated.

A case where components forming the conductive layer, the insulating layer, and the primer layer did not adhere at all to the adhesive surface of the separated cellophane adhesive tape, was evaluated as "A". A case where, with respect to the contact area between the second conductive layer and the adhesive tape, the second conductive layer in less than 3% of the area was separated and adhered to the adhesive surface of the adhesive tape, was evaluated as "B". A case where, with respect to the contact area between the second conductive layer and the adhesive tape, the second conductive layer in 3% or more and less than 30% of the area was separated and adhered to the adhesive surface of the adhesive tape, was evaluated as "C". A case where, with respect to the contact area between the second conductive layer and the adhesive tape, the second conductive layer in 30% or more of the area was separated and adhered to the adhesive tape, was evaluated as "D".

[Method for Evaluating Adhesion after Wet-Heat Test]

The laminates obtained in Examples and Comparative examples were left in an environment at a temperature of 85° C. and a relative humidity of 85% for 1000 hours.

Evaluations in terms of adhesion were carried out in the same manner as in the [Method for evaluating adhesion] except that the laminates having been left were used.

[Method for Evaluating Continuity (First Conductive Layer)]

Continuity was checked with a Loresta GP MCP T610 type (resistivity meter manufactured by Mitsubishi Chemical Analytech Co., Ltd.) by bringing BSP probes into contact with two tabs connected to the first conductive layer of each laminate. Laminates having continuity were evaluated as "A". Laminates not having continuity or not having a plating layer due to lack of continuity were evaluated as "D".

[Method for Evaluating Continuity after Wet-Heat Test (First Conductive Layer)]

The laminates obtained in Examples and Comparative examples were left in an environment at a temperature of 85° C. and a relative humidity of 85% for 1000 hours.

Evaluations in terms of insulation were carried out in the same manner as in the [Method for evaluating continuity (first conductive layer)] except that the laminates having been left were used.

[Method for Evaluating Continuity (Second Conductive Layer)]

Continuity was checked with a Loresta GP MCP T610 type (resistivity meter manufactured by Mitsubishi Chemical Analytech Co., Ltd.) by bringing BSP probes into contact with two tabs connected to the second conductive layer of each laminate. Laminates having continuity were evaluated as "A". Laminates not having continuity or not having a plating layer due to lack of continuity were evaluated as "D".

[Method for Evaluating Continuity after Wet-Heat Test (Second Conductive Layer)]

The laminates obtained in Examples and Comparative examples were left in an environment at a temperature of 85° C. and a relative humidity of 85% for 1000 hours.

Evaluations in terms of insulation were carried out in the same manner as in the [Method for evaluating continuity (second conductive layer)] except that the laminates having been left were used.

[Method for Evaluating Insulation of Insulating Layer]

Continuity was checked with a Loresta GP MCP T610 type (resistivity meter manufactured by Mitsubishi Chemical Analytech Co., Ltd.) by bringing one of the BSP probes into contact with a tab connected to the first conductive layer and bringing the other BSP probe into contact with a tab connected to the second conductive layer. Laminates not having continuity and maintaining insulation between the first conductive layer and the second conductive layer were evaluated as "A". Laminates having continuity were evaluated as "D".

[Method for Evaluating Insulation after Wet-Heat Test]

The laminates obtained in Examples and Comparative examples were left in an environment at a temperature of 85° C. and a relative humidity of 85% for 1000 hours.

Evaluations in terms of insulation were carried out in the same manner as in the [Method for evaluating insulation of insulating layer] except that the laminates having been left were used.

TABLE 1

| | Example 1 | Example 2 | Example 3 | Example 4 | Example 5 |
|---|---|---|---|---|---|
| Support (A) | Kapton 150EN-C | Kapton 150EN-C | Kapton 150EN-C | Kapton 150EN-C | Kapton 150EN-C |
| First primer layer (B-1) | Y-1 | Y-3 | Y-3 | Y-3 | Y-2 |
| First plating seed layer (C-1) | Fluid 1 | Fluid 1 | Fluid 1 | Fluid 1 | Fluid 1 |
| First plating layer (C-2) | Electrolytic copper plating | Electrolytic copper plating | Electrolytic copper plating | Electrolytic copper plating | Electrolytic copper plating |
| Insulating layer (D) | NICAFLEX CISA 2535 | NICAFLEX CISA 2535 | TFA-5602525 | Y-5 | Y-5 |
| Second primer layer (B-2) | Y-4 | Y-4 | Y-4 | Y-4 | Y-4 |
| Second plating seed layer (E-1) | Fluid 1 | Fluid 1 | Fluid 1 | Fluid 1 | Fluid 1 |

TABLE 1-continued

| | Example 1 | Example 2 | Example 3 | Example 4 | Example 5 |
|---|---|---|---|---|---|
| Second plating layer (E-2) | Electrolytic copper plating | Electrolytic copper plating | Electrolytic copper plating | Electrolytic copper plating | Electrolytic copper plating |
| Adhesion | A | A | A | A | A |
| Adhesion after wet-heat test | A | A | A | B | B |
| Continuity (first conductive layer) | A | A | A | A | A |
| Continuity after wet-heat test (first conductive layer) | A | A | A | A | A |
| Continuity (second conductive layer) | A | A | A | A | A |
| Continuity after wet-heat test (second conductive layer) | A | A | A | A | A |
| Insulation of insulating layer | A | A | A | A | A |
| Insulation after wet-heat test | A | A | A | A | A |

TABLE 2

| | Comparative example 1 | Comparative example 2 |
|---|---|---|
| Support (A) | Kapton 150EN-C | Kapton 150EN-C |
| First primer layer (B-1) | — | Y-3 |
| First plating seed layer (C-1) | Fluid 1 | Fluid 1 |
| First plating layer (C-2) | — | Electrolytic copper plating |
| Insulating layer (D) | — | NICAFLEX CISA 2535 |
| Second primer layer (B-2) | — | — |
| Second plating seed layer (E-1) | — | Fluid 1 |
| Second plating layer (E-2) | — | Electrolytic copper plating |
| Adhesion | Unmeasurable | D |
| Adhesion after wet-heat test | Unmeasurable | D |
| Continuity (first conductive layer) | Unmeasurable | A |
| Continuity after wet-heat test (first conductive layer) | Unmeasurable | A |
| Continuity (second conductive layer) | Unmeasurable | D |
| Continuity after wet-heat test (second conductive layer) | Unmeasurable | D |
| Insulation of insulating layer | Unmeasurable | A |
| Insulation after wet-heat test | Unmeasurable | A |

In Table 1 and Table 2, "Kapton 150EN-C" denotes the polyimide film (thickness: 37.5 μm) manufactured by DU PONT-TORAY CO., LTD.; "TFA-5602525" denotes a film manufactured by KYOCERA Chemical Corporation (thickness of insulating layer: 12 μm, thickness of adhesive layer: 20 μm); and "NICAFLEX CISA 2535" denotes a film manufactured by NIKKAN INDUSTRIES CO., LTD. (thickness of insulating layer: 25 μm, thickness of adhesive layer: 35 μm).

REFERENCE SIGNS LIST

1 upper surface of first primer layer (B-1); 2 first conductive layer (C); 3 tab; 4 upper surface of second primer layer (B-2); 5 second conductive layer (E); 6 layer (A) including support; 7 first primer layer (B-1); 8 first conductive layer (C); 9 insulating layer; 10 second primer layer (B-2); 11 second conductive layer (E)

20 top view of laminate (I)

21 top view of laminate (IV)

22 sectional view taken along alternating long and short dashed line 23 in laminate (IV)

The invention claimed is:

1. A laminate having a structure in which at least a layer including a support, a first primer layer, a first conductive layer, an insulating layer, a second primer layer, and a second conductive layer are laminated, wherein the first conductive layer includes a first plating seed layer formed by coating a portion of or entirety of a surface of the first primer layer with a fluid containing a conductive substance that is a transition metal or a compound of a transition metal, and a first plating layer formed on a surface of the first plating seed layer; and the second conductive layer includes a second plating seed layer formed by coating a portion of or entirety of a surface of the second primer layer with a fluid containing a conductive substance that is a transition metal or a compound of a transition metal, and a second plating layer formed on a surface of the second plating seed layer.

2. The laminate according to claim 1, wherein the first primer layer (B-1) and the second primer layer contain at least one resin selected from the group consisting of a urethane resin, a vinyl resin, and a urethane-vinyl composite resin.

3. The laminate according to claim 2, wherein the urethane-vinyl composite resin includes a shell layer formed of a urethane resin and a core layer formed of a vinyl resin.

4. The laminate according to claim 3, wherein the urethane resin has 2,000 mmol/kg to 5,500 mmol/kg of an alicyclic structure.

5. The laminate according to claim 1, wherein the insulating layer is formed of a polyimide varnish.

6. The laminate according to claim 1, wherein a resin forming the first primer layer and the second primer layer has a cross-linkable functional group.

7. The laminate according to claim 6, wherein the cross-linkable functional group is at least one thermally cross-linkable functional group selected from the group consisting of a methylolamide group and an alkoxymethylamide group.

8. The laminate according to claim 1, wherein the conductive substances contained in the fluid and the fluid are silver, and the first plating layer and the second plating layer are copper plating layers.

9. A conductive pattern comprising the laminate according to claim 1.

10. A method for producing a laminate, comprising a step of coating a portion of or entirety of a surface of a support with a primer for forming a first primer layer, and coating a portion of or entirety of the coated surface with a fluid containing a conductive substance that is a transition metal or a compound of a transition metal to provide a laminate of a layer including the support, the first primer layer, and a first plating seed layer; a step of plating a portion of or entirety of a surface of the first plating seed layer to form a first conductive layer in which a first plating layer is formed on the surface of the first plating seed layer; a step of placing an insulating-layer film or an insulating sheet on at least a portion of or entirety of a surface of the first plating layer, or coating at least a portion of or entirety of a surface of the first plating layer with a resin composition and drying the resin composition, to form an insulating layer; a step of coating a portion of or entirety of the insulating layer with a primer for forming a second primer layer to provide a coated surface and coating a portion of or entirety of the coated surface with a fluid containing a conductive substance that is a transition metal or a compound of a transition metal to provide a laminate including the insulating layer, the second primer layer, and a second plating seed layer; and a step of plating a portion of or entirety of a surface of the second plating seed layer to form a second conductive layer in which a second plating layer is formed on the surface of the second plating seed layer.

\* \* \* \* \*